(12) United States Patent
Nagumo

(10) Patent No.: US 6,388,695 B1
(45) Date of Patent: May 14, 2002

(54) DRIVING CIRCUIT WITH SWITCHING ELEMENT ON STATIC CURRENT PATH, AND PRINTER USING SAME

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/415,309

(22) Filed: Oct. 8, 1999

(30) Foreign Application Priority Data

Oct. 8, 1998 (JP) .......................................... 10-286437

(51) Int. Cl.[7] .............................. B41J 2/45; G05F 3/02; H02J 1/00
(52) U.S. Cl. ......................... 347/237; 327/544; 307/38
(58) Field of Search ................................. 347/237, 211, 347/132, 9, 12, 13; 327/544, 108, 109, 82, 83; 307/38, 39, 40, 41

(56) References Cited

U.S. PATENT DOCUMENTS

| | | | | |
|---|---|---|---|---|
| 4,780,730 A | * | 10/1988 | Dodge et al. ............... | 347/237 |
| 5,253,934 A | * | 10/1993 | Potucek et al. ............. | 347/237 |
| 5,420,528 A | * | 5/1995 | Shigehara ............... | 327/544 X |
| 5,900,741 A | * | 5/1999 | Roohparvar ................. | 326/34 |
| 5,990,920 A | * | 11/1999 | Nagumo et al. ............ | 347/237 |
| 6,018,265 A | * | 1/2000 | Keshtbod ..................... | 327/540 |

FOREIGN PATENT DOCUMENTS

JP 58-199176 * 11/1983 .............. B41J/3/20

* cited by examiner

Primary Examiner—David F. Yockey
(74) Attorney, Agent, or Firm—Akin, Gump, Strauss, Hauer & Feld, L.L.P.

(57) ABSTRACT

A driving circuit generates an internal control voltage that controls the driving current supplied to a group of driven elements in a printer or other device. Generation of the control voltage involves the flow of current on one or more static current paths. The driving circuit includes switching elements that open these static current paths in response to a standby command, to reduce standby power consumption of the printer or other device, and to enable quiescent-current testing of the driving circuit. The standby command may be given by a combination of signals that are also used for other purposes.

13 Claims, 26 Drawing Sheets

DRIVING CIRCUIT WITH SWITCHING ELEMENT ON STATIC CURRENT PATH, AND PRINTER USING SAME

BACKGROUND OF THE INVENTION

The present invention relates to a circuit that drives a group of driven elements such as light-emitting diodes, heating elements, or display elements, and to a printer employing this driving circuit.

The invented driving circuit can be fabricated as an integrated circuit (IC) incorporating complementary metal-oxide-semiconductor (CMOS) logic. One object of the invention is to simplify the testing of an integrated driving circuit of this type.

A simple method of testing a CMOS IC is to measure the amount of current drawn by the IC in its quiescent state, when all inputs to the IC are held at constant logic levels. In principle, a CMOS IC draws current only when its input levels change; no current should flow in the quiescent state. In practice, if the IC is free of electrical faults, the measured quiescent current ($IDD_q$) is in the picoampere range, or is at most a few microamperes. Internal defects that cause short circuits between adjacent signal paths in the IC are revealed when a higher quiescent current is measured.

This test, known as a quiescent-current test or $IDD_q$ test, detects electrical faults more quickly and efficiently than conventional functional tests, which apply numerous test patterns to the input terminals of the IC and check the resulting outputs at the output terminals to confirm that internal logic functions are being performed correctly.

The efficient and inexpensive $IDD_q$ test cannot be applied to many conventional driving ICs, however, because these ICs are not purely CMOS circuits. They include amplifiers with internal current sources that draw current at all times, even in the quiescent state. The current drawn by these current sources is so large that any variations in quiescent current caused by electrical faults in logic circuits are effectively masked. Less efficient and more expensive functional tests must therefore be carried out instead.

When this type of conventional driving IC is employed in a printer, a further problem is that the current sources draw current whenever the printer's power is switched on, even if the printer is not operating. Since a printer may include many driving ICs, the current drawn can significantly increase the printer's standby power consumption, raising environmental issues. Under the International Energy-Star program, for example, the standby power consumption of a printer or facsimile machine in the maximum seven-page-per-minute class is only fifteen watts (15 W). Another object of the invention, accordingly, is to enable a printer to meet stringent standby power-consumption requirements.

SUMMARY OF THE INVENTION

The invented driving circuit drives a plurality of driven elements according to externally supplied driving data. The driving circuit includes a plurality of drive output circuits, and a transfer circuit that transfers the driving data to the drive output circuits. The drive output circuits supply driving current to the driven elements, responsive to the driving data and a control voltage.

The control voltage is generated in a control-voltage generating circuit having a static current path. The control-voltage generating circuit also has a switching element that opens and closes the static current path. The switching element is controlled by a control circuit that causes the switching element to open the static current path when a standby command is received. The control-voltage generating circuit and the control circuit are part of the driving circuit.

The standby command may be given by a single external signal. Alternatively, the standby command may be given by a combination of external signals that are also used for controlling other circuits, such as the transfer circuit and drive output circuits.

The invented driving circuit may be an integrated circuit formed on a single semiconductor chip. The invention also provides a printer having a plurality of such integrated driving circuits. The printer includes a printing control unit that gives the standby command to the driving circuits.

By opening the static current path, the invented driving circuit and printer reduce standby power consumption. The standby command also reduces current consumption to a level low enough to permit quiescent-current testing of the invented driving circuit.

DETAILED DESCRIPTION OF THE INVENTION

Figure 1:
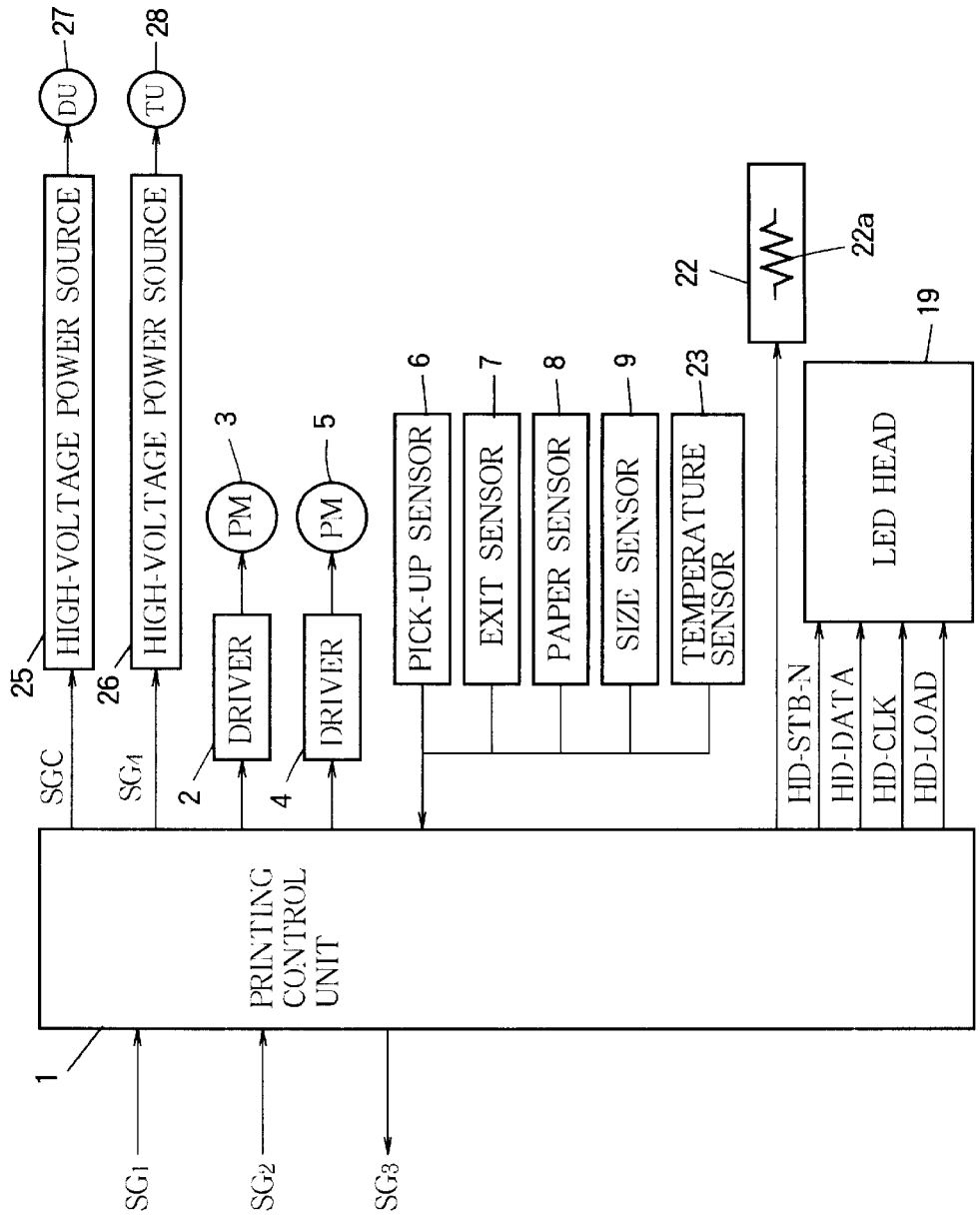
FIG. 1 is a block diagram of a conventional electrophtographic printer.

Embodiments of the invention will be described with reference to the attached drawings, in which like parts are indicated by like reference characters. A conventional printer and driving circuit, on which the embodiments are based, will also be described, to avoid repeated descriptions of the same elements in different embodiments. The suffixes P and N will be attached to certain signal names, P denoting positive logic (active high), N denoting negative logic (active low).

Referring to FIG. 1, the conventional printer is an electrophotographic printer of the type having a light-emitting-diode (LED) printing head. The printer comprises a printing control unit 1, a first motor driver 2 and stepping motor or pulse motor (PM) 3, a second motor driver 4 and pulse motor 5, a pick-up sensor 6, an exit sensor 7, a paper sensor 8, a size sensor 9, an LED head 19, a fuser 22 with a heater 22a, a temperature sensor 23, a negative high-voltage power source 25, a positive high-voltage power source 26, a developer unit 27, and a transfer unit 28.

The printing control unit 1 is a computing device comprising a microprocessor, read-only memory (ROM), random-access memory (RAM), input-output ports, timers, and other facilities. Receiving commands and data from a higher-order controller, the printing control unit 1 provides driving data to the LED head 19, and generates signals that control the printing sequence. Specifically, the printing control unit 1 controls the power sources 25, 26, motor drivers 2, 4, LED head 19, and fuser 22.

The printing sequence starts when the printing control unit 1 receives a printing command $SG_1$ from the higher-order controller. First, the temperature sensor 23 is checked to determine whether the fuser 22 is at the necessary temperature for printing. If it is not, current is fed to the heater 22a to raise the temperature of the fuser 22.

When the fuser 22 is ready, the printing control unit 1 commands motor driver 2 to drive pulse motor 3, which turns a photosensitive drum and associated rollers (not visible). The printing control unit 1 also activates a charge signal SGC to turn on high-voltage power source 25, charging the developer unit 27 to a negative potential. The paper sensor 8 is checked to confirm that paper (not visible) is present, and the size sensor 9 is checked to determine the size of the paper. If paper is present, pulse motor 5 is driven according to the size of the paper, first in one direction to transport the paper to a starting position sensed by the pick-up sensor 6, then in the opposite direction to transport the paper into the printing mechanism.

When the paper is in position for printing, the printing control unit 1 begins receiving print data $SG_2$ from the higher-order controller, in synchronization with a timing signal $SG_3$. The printing control unit 1 sends driving data HD-DATA to the LED head 19 in synchronization with a clock signal HD-CLK. After sending each line of data, the printing control unit 1 activates a load timing signal HD-LOAD, causing the LED head 19 to latch the data, then activates a strobe timing signal HD-STB-N. These timing signals HD-LOAD and HD-STB-N will be referred to below simply as the load signal and strobe signal.

The LED head 19 comprises a linear array of light-emitting diodes (LEDs). While the strobe signal is active, the LEDs corresponding to 1's in the driving data turn on, illuminating respective dots on the photosensitive drum. The photosensitive drum is negatively charged, but the charge escapes from the illuminated dots, forming a latent electrostatic image. Toner particles, supplied by the negatively charged developer unit 27, adhere to the illuminated dots, developing the image. Next, the printing control unit 1 activates a transfer signal $SG_4$, turning on high-voltage power source 26, which supplies a positive voltage to the transfer unit 28. As the paper passes between the photosensitive drum and transfer unit 28, the toner particles are transferred from the drum to the paper. The printing control unit 1 controls high-voltage power source 26 according to the information provided by the pick-up sensor 6 and size sensor 9, so that high-voltage power source 26 is switched on only during the transfer process.

Next, the paper is transported to the fuser 22, and the toner image is fused onto the paper by heat and pressure. Finally, the printed sheet of paper passes the exit sensor 7 and is ejected from the printer, at which point the printing control unit 1 turns off high-voltage power source 25 and halts pulse motor 3.

Figure 2:
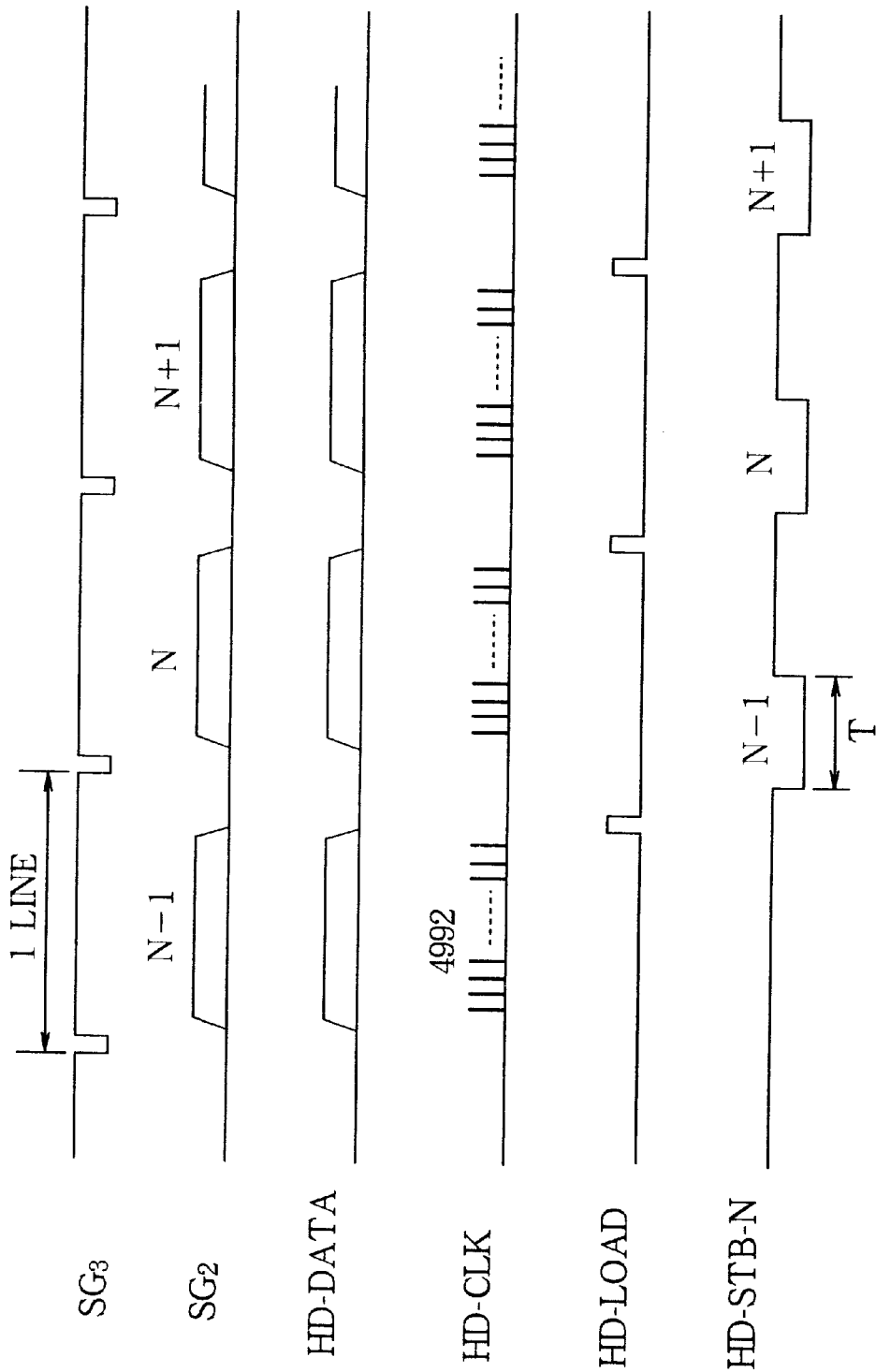
FIG. 2 is a timing diagram illustrating a conventional printing sequence.

FIG. 2 illustrates the part of the printing sequence concerned with the illumination of three dot lines (lines N−1, N, and N+1, where N is an arbitrary integer). The timing signal $SG_3$ goes low to indicate the beginning of each line. The print data $SG_2$ received by the printing control unit 1 become the driving data HD-DATA supplied to the LED head 19 in synchronization with the clock signal HD-CLK. The number of dots per line is, for example, four thousand nine hundred ninety-two (4992, a number suitable for printing six hundred dots per inch on A4-size paper). The load signal HD-LOAD is activated at the end of each line. The strobe signal HD-STB-N is then activated for a time T that produces the necessary amount of illumination. As shown, this time T may overlap the time during which driving data are being transferred for the next line.

Figure 3:
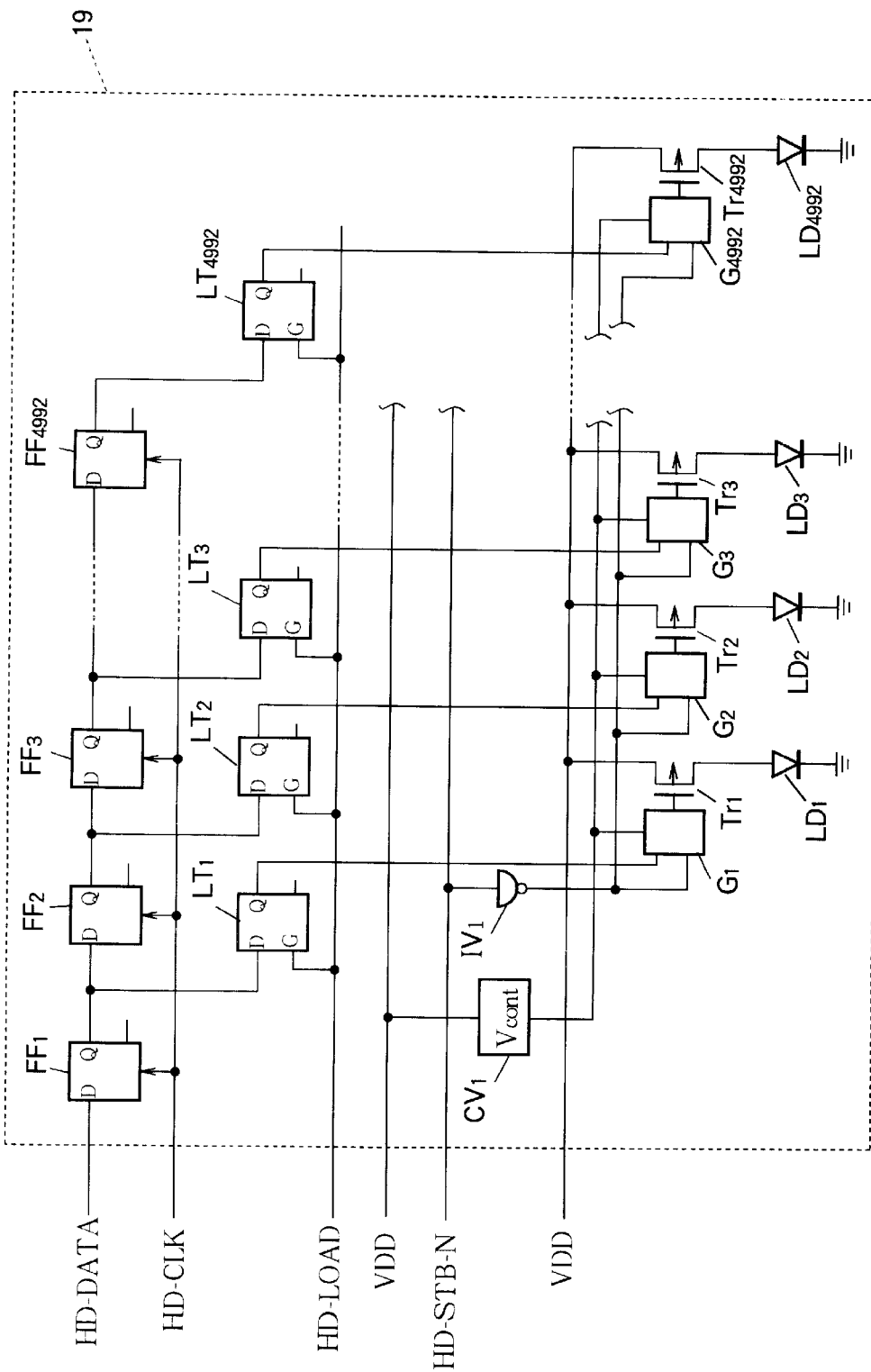
FIG. 3 is a circuit diagram illustrating the structure of the LED head in FIG. 1.

FIG. 3 shows the internal structure of the LED head 19. The driving data HD-DATA are shifted into a shift register comprising D-type flip-flops $FF_1$ to $FF_{4992}$, and latched in latches $LT_1$ to $LT_{4992}$. The latch outputs are strobed in pre-buffer circuits $G_1$ to $G_{4992}$, and drive p-channel metal-oxide-semiconductor (PMOS) transistors $Tr_1$ to $Tr_{4992}$, which supply current to the light-emitting diodes $LD_1$ to $LD_{4992}$. The pre-buffer circuits and transistors constitute the drive output circuits. The flip-flops and latches constitute a transfer circuit that transfers the driving data HD-DATA to the drive output circuits.

The circuits in FIG. 3 are divided among twenty-six driver ICs and twenty-six LED array chips. Each driver IC includes a control-voltage generating circuit and an inverter. Only the control-voltage generating circuit $CV_1$ and inverter $IV_1$ belonging to the first driver IC are shown in FIG. 3. The control-voltage generating circuits $CV_1$ to $CV_{26}$ receive a power-supply voltage VDD from an external power supply and generate a control voltage $V_{cont}$. The inverters $IV_1$ to $IV_{26}$ invert the strobe signal HD-STB-N, generating a positive-logic strobe signal.

The flip-flops $FF_1$ to $FF_{4992}$ are coupled in cascade, the non-inverting output terminal (Q) of each flip-flop being coupled to the data input terminal (D) of the next flip-flop. The driving data signal HD-DATA is supplied to the data input terminal D of the first flip-flop $FF_1$. Each flip-flop has a clock input terminal that receives the clock signal HD-CLK. A data bit is stored in the first flip-flop $FF_1$, then shifted one flip-flop to the right in the drawing at each cycle of the clock signal HD-CLK. After four thousand nine hundred ninety-two clock cycles, the flip-flops store the dot data for an entire line.

Each latch $LT_k$ (k is an arbitrary integer from 1 to 4992) has a data input terminal D coupled to the non-inverting output terminal (Q) of the corresponding flip-flop $FF_k$, a gating input terminal G that receives the load signal HD-LOAD, and a non-inverting output terminal Q coupled to the corresponding pre-buffer circuit $G_k$. When the load signal HD-LOAD goes low, the latch $LT_k$ latches the logic level received from flip-flop $FF_k$, and supplies the latched logic level to the pre-buffer circuit $G_k$ until the load signal HD-LOAD goes high again.

Each pre-buffer circuit $G_k$ functions as a two-input NAND gate. The two inputs are the data signal received from latch $LT_k$, and the strobe signal received from one of the inverters $IV_1$ to $IV_{26}$. The high logic level output by the pre-buffer circuit is the power-supply voltage VDD. The low logic level output by the pre-buffer circuit is the control voltage $V_{cont}$. The output voltage drives the gate electrode of the corresponding transistor $Tr_k$.

Each transistor $Tr_k$ has a source electrode that receives the power-supply voltage VDD, and a drain electrode coupled to the anode of the corresponding light-emitting diode $LD_k$. The cathode of light-emitting diode $LD_k$ is coupled to ground. When transistor $Tr_k$ is switched on, light-emitting diode $LD_k$ receives drive current from transistor $Tr_k$ and emits light. When the strobe signal HD-STB-N is active (low), each transistor $Tr_k$ is switched on or off according to the data held in the corresponding latch $LT_k$. When the strobe signal HT-STB-N is inactive (high), all transistors $Tr_k$ are switched off and no light-emitting diodes are driven.

Figure 4:
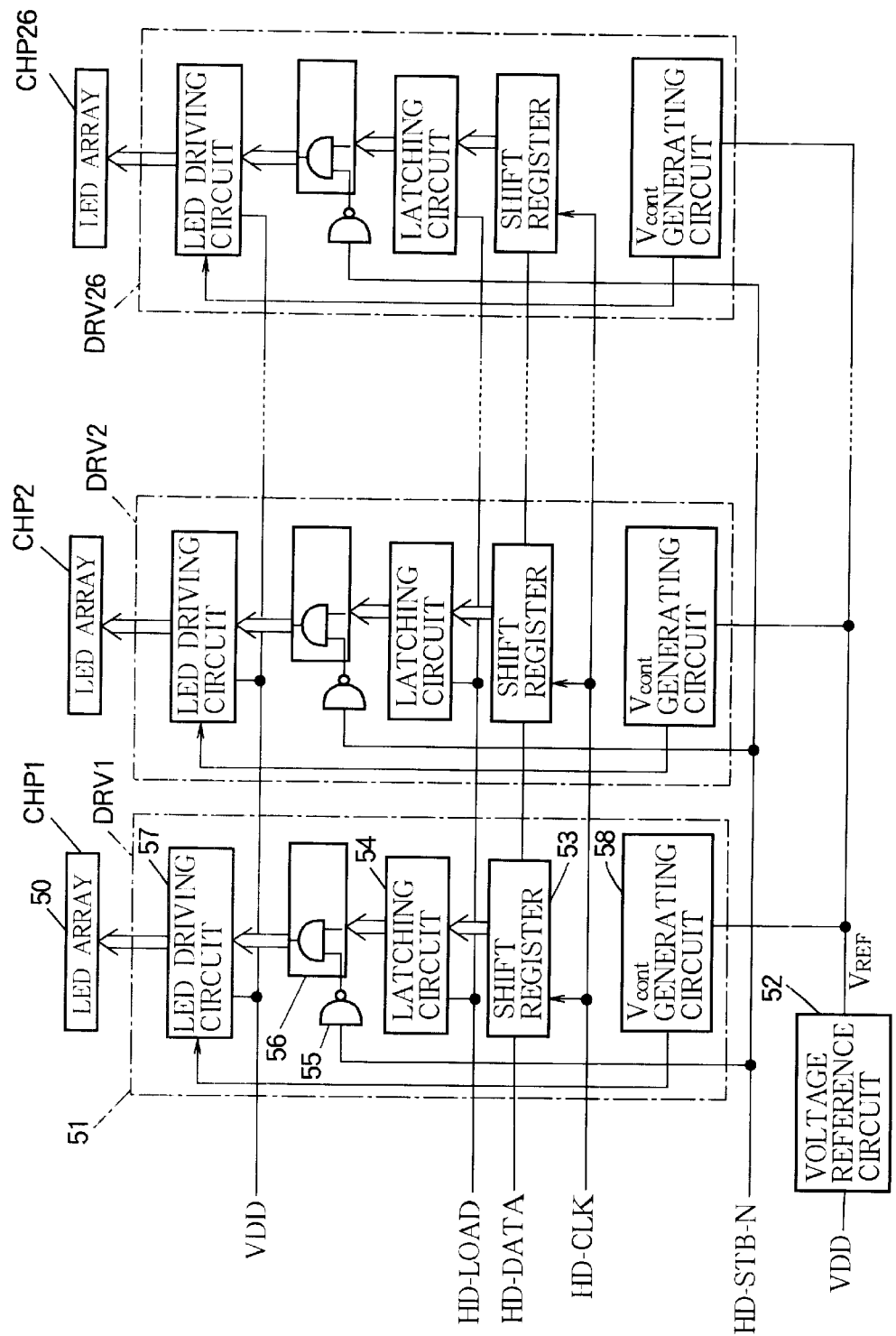
FIG. 4 is a block diagram illustrating the structure of the LED head in FIG. 1.

FIG. 4 illustrates the twenty-six LED array chips 50 (CHP1 to CHP26) and driver ICs 51 (DRV1 to DRV26). The driver ICs receive a reference voltage $V_{REF}$ from a voltage reference circuit 52, which was omitted from FIG. 3. Each LED array chip 50 includes one hundred ninety-two light-emitting diodes. CHP1 includes the light-emitting diodes $LD_1$ to $LD_{192}$ shown in FIG. 3, while CHP26 includes $LD_{4801}$ to $LD_{4992}$.

Each driver IC comprises a shift register 53, a latching circuit 54, an inverter 55, an AND logic circuit 56, an LED driving circuit 57, and a control-voltage generating circuit 58.

In DRV1, for example, the shift register 53 includes flip-flops $FF_1$ to $FF_{192}$ shown in FIG. 3, the latching circuit 54 includes latch circuits $LT_1$ to $LT_{192}$, the inverter 55 corresponds to inverter $IV_1$, and the control-voltage generating circuit 58 corresponds to control-voltage generating circuit $CV_1$. The AND logic circuit 56 and LED driving circuit 57 collectively correspond to pre-buffers $G_1$ to $G_{192}$ and transistors $Tr_1$ to $Tr_{192}$. The AND logic circuit 56 performs the AND logic function of pre-buffers $G_1$ to $G_{192}$. The LED driving circuit 57 performs the NOT logic function of pre-buffers $G_1$ to $G_{192}$ and the driving function of transistors $Tr_1$ to $Tr_{192}$, using the control voltage ($V_{cont}$) output from the control-voltage generating circuit 58.

In DRV26, the shift register 53 includes flip-flops $FF_{4801}$ to $FF_{4992}$ shown in FIG. 3, the latching circuit 54 includes latches $LT_{4801}$ to $LT_{4992}$, the inverter 55 corresponds to inverter $IV_{26}$, the AND logic circuit 56 and LED driving circuit 57 collectively correspond to pre-buffers $G_{4801}$ to $G_{4992}$ and transistors $Tr_{4801}$ to $Tr_{4992}$, and the control-voltage generating circuit 58 corresponds to control-voltage generating circuit $CV_{26}$.

The hundred ninety-two flip-flops in each shift register 53 are coupled in cascade, and the twenty-six shift registers 53 are themselves cascaded, so that all of the flip-flops are cascaded, as shown in FIG. 3. The wide arrows in FIG. 4 indicate parallel connections from the shift registers 53 to the latching circuits 54, then to the AND logic circuits 56 and LED driving circuits 57, as shown in FIG. 3. Each latching circuit 54 responds to the load signal HD-LOAD by simultaneously latching data for one hundred ninety-two dots. When the strobe signal HD-STB-N goes low, the AND logic circuits 56 pass the latched data to the LED driving circuits 57, which drive the individual light-emitting diodes in the LED array chips 50. Each AND logic circuit 56 includes one hundred ninety-two AND gates, of which only one is shown in the drawing.

The voltage reference circuit 52 receives the power-supply voltage VDD and generates a reference voltage $V_{REF}$, which is supplied to the control-voltage generating circuits 58 in the driver ICs DRV1 to DRV26. The control-voltage generating circuits 58 use the reference voltage $V_{REF}$ to generate the control voltage supplied to the LED driving circuits 57.

Figure 5:
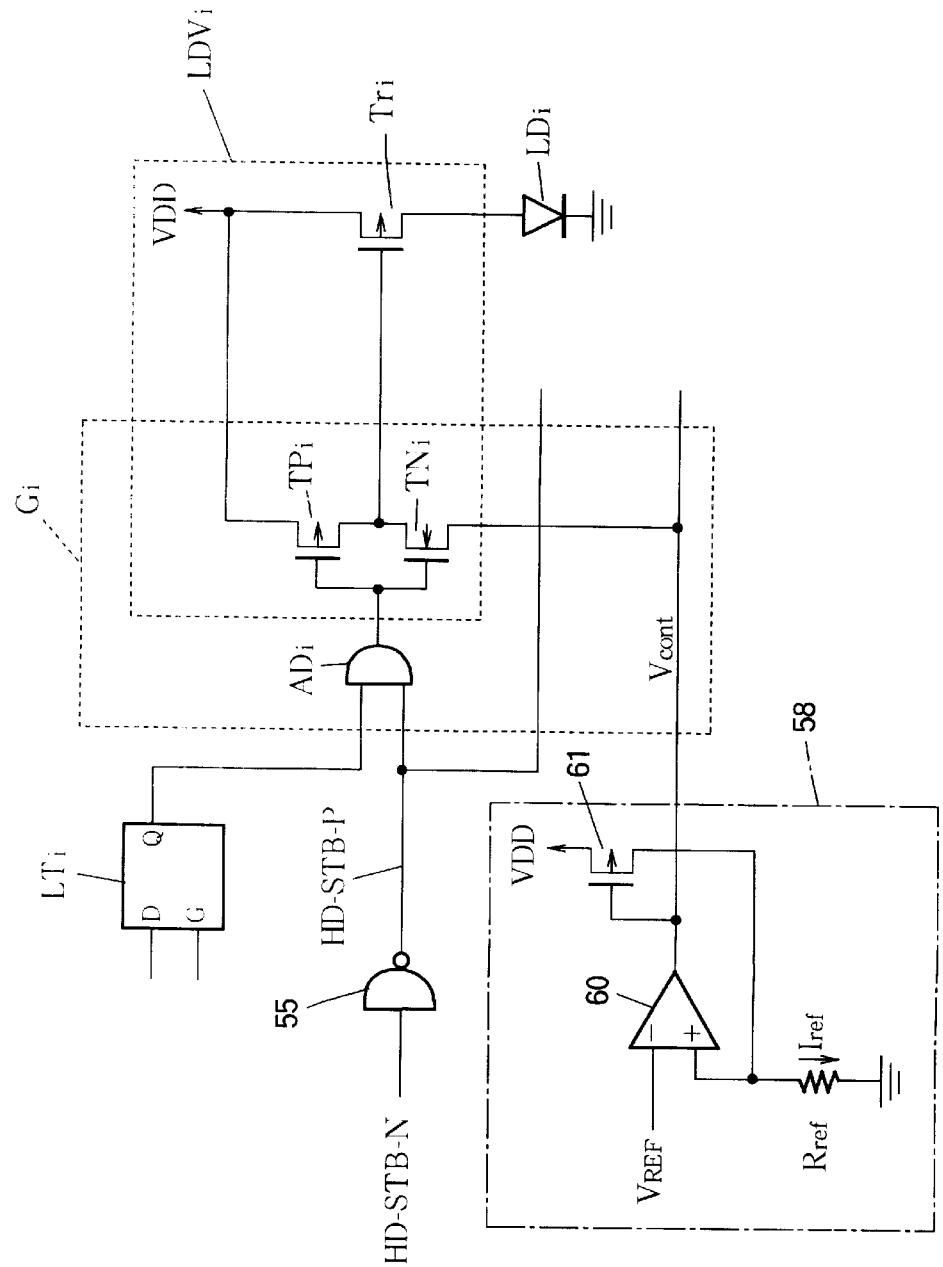
FIG. 5 is a circuit diagram illustrating conventional circuits for driving a light-emitting diode.

FIG. 5 shows the circuits related to the driving of the i-th light-emitting diode $LD_i$, where i is a positive integer. The i-th latch $LT_i$ is part of one of the latching circuits 54. The strobe signal HD-STB-N is inverted by inverter 55 and combined with the output of latch $LT_i$ by AND gate $AD_i$, which belongs to one of the AND logic circuits 56. The output of AND gate $AD_i$ is supplied to the i-th LED driver $LDV_i$, which is part of one of the LED driving circuits 57. AND gate $AD_i$ and LED driver $LDV_i$ constitute a single drive output circuit.

The i-th LED driver $LDV_i$ comprises the PMOS transistor $Tr_i$ that was shown in FIG. 3, another PMOS transistor $TP_i$, and an n-channel metal-oxide-semiconductor (NMOS) transistor $TN_i$. The output terminal of AND gate $AD_i$ is coupled to the gate electrodes of transistors $TP_i$ and $TN_i$. The drain electrodes of transistors $TP_i$ and $TN_i$ are coupled to the gate electrode of transistor $Tr_i$. The source electrodes of transistors $TP_i$ and $Tr_i$ receive the power-supply voltage VDD. The source electrode of transistor $TN_i$ receives the control voltage $V_{cont}$ output by the control-voltage generating circuit 58. The drain electrode of transistor $Tr_i$ is coupled to the anode of light-emitting diode $LD_i$. AND gate $AD_i$ and transistors $TP_i$ and $TN_i$ constitute the pre-buffer circuit $G_i$ that was shown in FIG. 3.

The control-voltage generating circuit 58 comprises a resistor $R_{ref}$, an operational amplifier 60, and a PMOS transistor 61. The inverting (−) input terminal of the operational amplifier 60 receives the reference voltage $V_{REF}$ from the voltage reference circuit 52 shown in FIG. 4. The non-inverting (+) input terminal of the operational amplifier 60 is coupled to the drain electrode of PMOS transistor 61, and to one terminal of resistor $R_{ref}$. The other terminal of resistor $R_{ref}$ is coupled to ground. The output terminal of the operational amplifier 60 is coupled to the gate electrode of PMOS transistor 61, and to the source electrode of transistor $TN_i$ in each pre-buffer circuit $G_i$. The source electrode of PMOS transistor 61 receives the power-supply voltage VDD.

Feedback in the control-voltage generating circuit 58 maintains a constant flow of reference current $I_{ref}$ through resistor $R_{ref}$ and PMOS transistor 61, keeping the voltage at the non-inverting (+) input terminal of the operational amplifier 60 equal to the reference voltage $V_{REF}$. The value of $I_{ref}$ is determined by the reference voltage $V_{REF}$ and the resistance value of resistor $R_{ref}$, and is not affected by variations in the supply voltage VDD. When light-emitting diode $LD_i$ is driven, transistor $Tr_i$ and transistor 61 operate as a current mirror, both transistors being driven by the same control voltage $V_{cont}$. The driving current supplied to light-emitting diode $LD_i$ is therefore independent of VDD variations.

Figure 6:
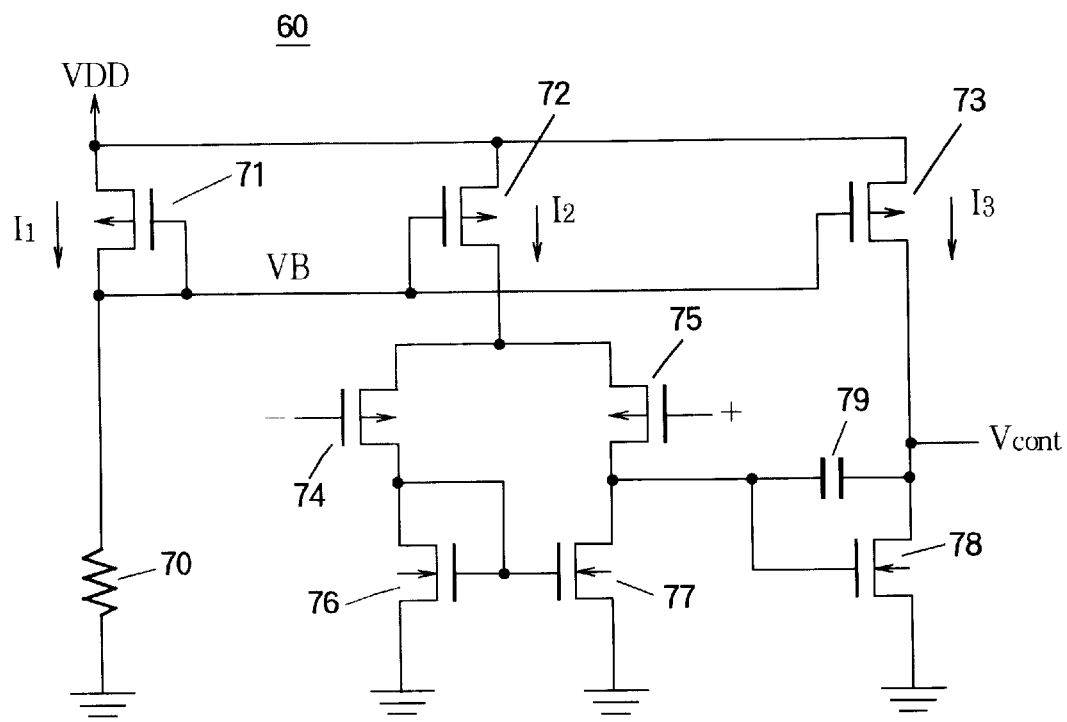
FIG. 6 is a circuit diagram illustrating the conventional structure of the operational amplifier in FIG. 5.

FIG. 6 shows the internal structure of the operational amplifier 60, comprising a resistor 70, PMOS transistors 71 to 75, NMOS transistors 76 to 78, and a capacitor 79.

Resistor 70 and PMOS transistor 71 generate a bias voltage VB, which is supplied to the gate electrodes of PMOS transistors 71, 72, and 73. The source electrode of transistor 71 is coupled to the power supply VDD. The gate and drain electrodes of transistor 71 are both coupled to the gate electrodes of transistors 72 and 73, and to one terminal of resistor 70. The other terminal of resistor 70 is coupled to ground. The bias voltage VB is generated at the non-grounded terminal of resistor 70, by passage of current $I_1$ through resistor 70.

PMOS transistors 72, 74, and 75 and NMOS transistors 76 and 77 constitute a differential amplifier circuit. The gate electrode of PMOS transistor 72 receives the gate bias voltage VB. The source electrode of PMOS transistor 72 is coupled to the power supply VDD. The drain electrode of PMOS transistor 72 is coupled to the source electrodes of PMOS transistors 74 and 75. The gate electrode of PMOS transistor 74 is the inverting (−) input terminal of the operational amplifier 60. The gate electrode of PMOS transistor 75 is the non-inverting (+) input terminal of the operational amplifier 60. The drain electrode of PMOS transistor 74 is coupled to the gate and drain electrodes of NMOS transistor 76 and to the gate electrode of NMOS transistor 77. The drain electrode of PMOS transistor 75 is coupled to the drain electrode of NMOS transistor 77, the gate electrode of NMOS transistor 78, and one plate of the capacitor 79. The source electrodes of NMOS transistors 76 and 77 are both coupled to ground.

PMOS transistor 73, NMOS transistor 78, and the capacitor 79 constitute an inverting amplifier circuit that amplifies the voltage output by the differential amplifier and outputs the amplified voltage as the control voltage $V_{cont}$. The source electrode of PMOS transistor 73 is coupled to the power supply VDD. The gate electrode of PMOS transistor 73 receives the bias voltage VB. The drain electrode of PMOS transistor 73 is coupled to the drain electrode of NMOS transistor 78 and to the other plate of the capacitor 79. The capacitor 79 is coupled in series between the gate and drain electrodes of NMOS transistor 78. The source electrode of NMOS transistor 78 is coupled to ground. The output terminal of the-operational amplifier 60 is the node at which the drain electrodes of PMOS transistor 73 and NMOS transistor 78 are interconnected.

PMOS transistors 71, 72, 73 function as current sources, supplying currents $I_1$, $I_2$, $I_3$, respectively. The overall circuit configuration of the operational amplifier 60 is that of a current mirror in which current $I_1$ is the control current, currents $I_2$ and $I_3$ being proportional to $I_1$. The paths taken by currents $I_1$, $I_2$, $I_3$, and by the reference current $I_{ref}$ in FIG. 5, are static current paths, meaning that current flows on these paths constantly, regardless of whether the driver IC is operating or quiescent. This current flow causes needless power consumption during standby. Currents $I_1$, $I_3$, and $I_{ref}$ flow whenever power (VDD) is supplied, regardless of the value of the reference voltage $V_{REF}$. This current flow prevents quiescent-current testing of the driver IC.

1st EMBODIMENTS

The first embodiment adds switching elements to the control-voltage generating circuit to open the above static current paths in the standby mode. The switching elements are controlled on command from the printing control unit.

Figure 7:
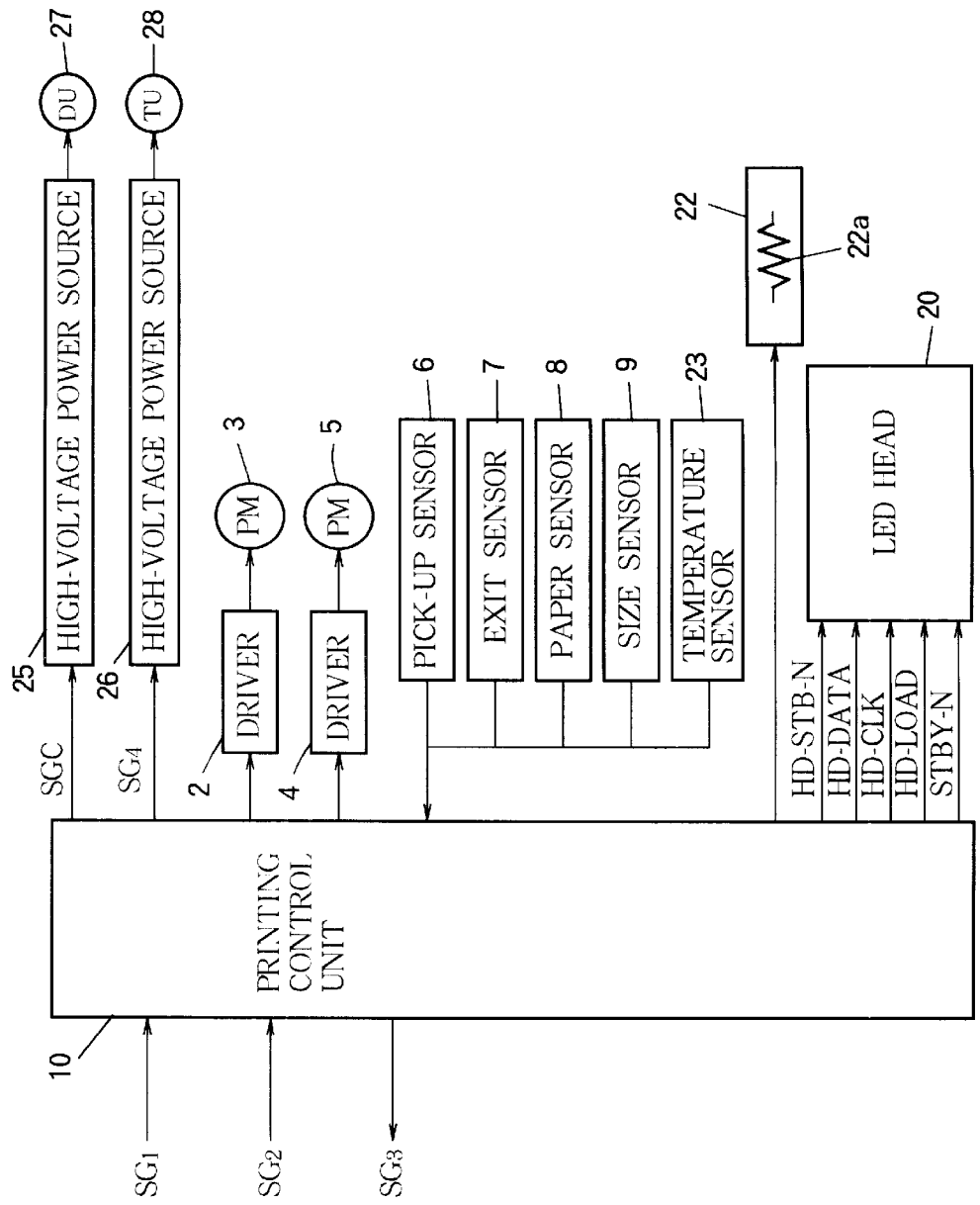
FIG. 7 is a block diagram of an electrophotographic printer illustrating a first embodiment of the invention.

Referring to FIG. 7, the first embodiment is an electrophotographic printer differing from the conventional electrophotographic printer in regard to the printing control unit 10 and LED head 20. The standby command is given by a standby mode control signal STBY-N sent from the printing control unit 10 to the LED head 20. The other signals and elements in FIG. 7 are similar to the conventional signals and elements in FIG. 1.

Figure 8:
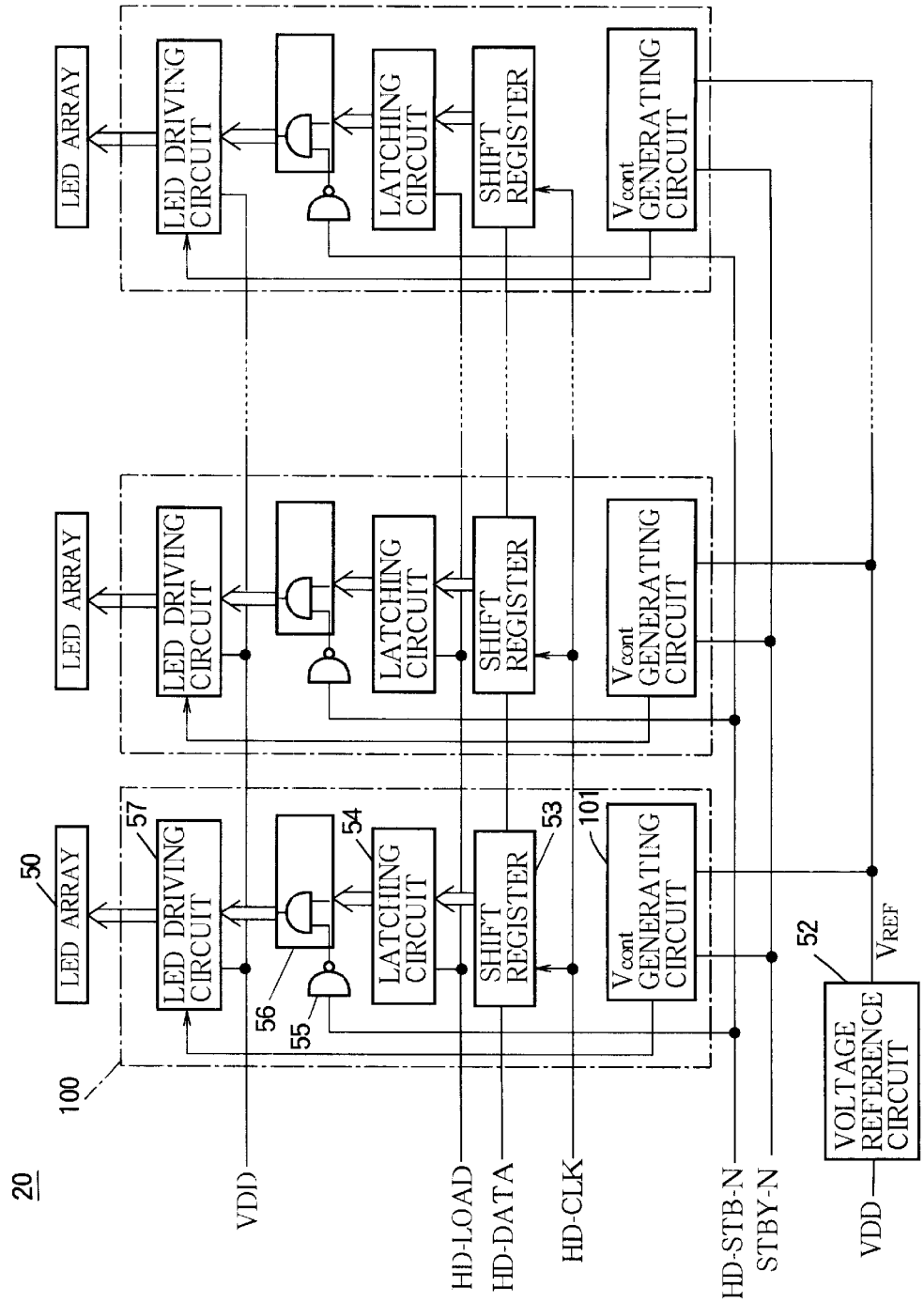
FIG. 8 is a block diagram illustrating the structure of the LED head in FIG. 7.

FIG. 8 shows the internal structure of the LED head 20. As in the conventional electrophotographic printer, the LED head 20 comprises twenty-six LED array chips 50, a voltage reference circuit 52, and twenty-six driver ICs 100. Each driver IC 100 comprises a shift register 53, a latching circuit 54, an inverter 55, an AND logic circuit 56, and an LED driving circuit 57 as described above, and a control-voltage ($V_{cont}$) generating circuit 101 that differs from the control-voltage generating circuit in the conventional driver IC. The standby mode control signal STBY-N is supplied to the control-voltage generating circuit 101 in each driver IC 100. Each driver IC 100 is formed on a separate semiconductor chip.

Figure 9:
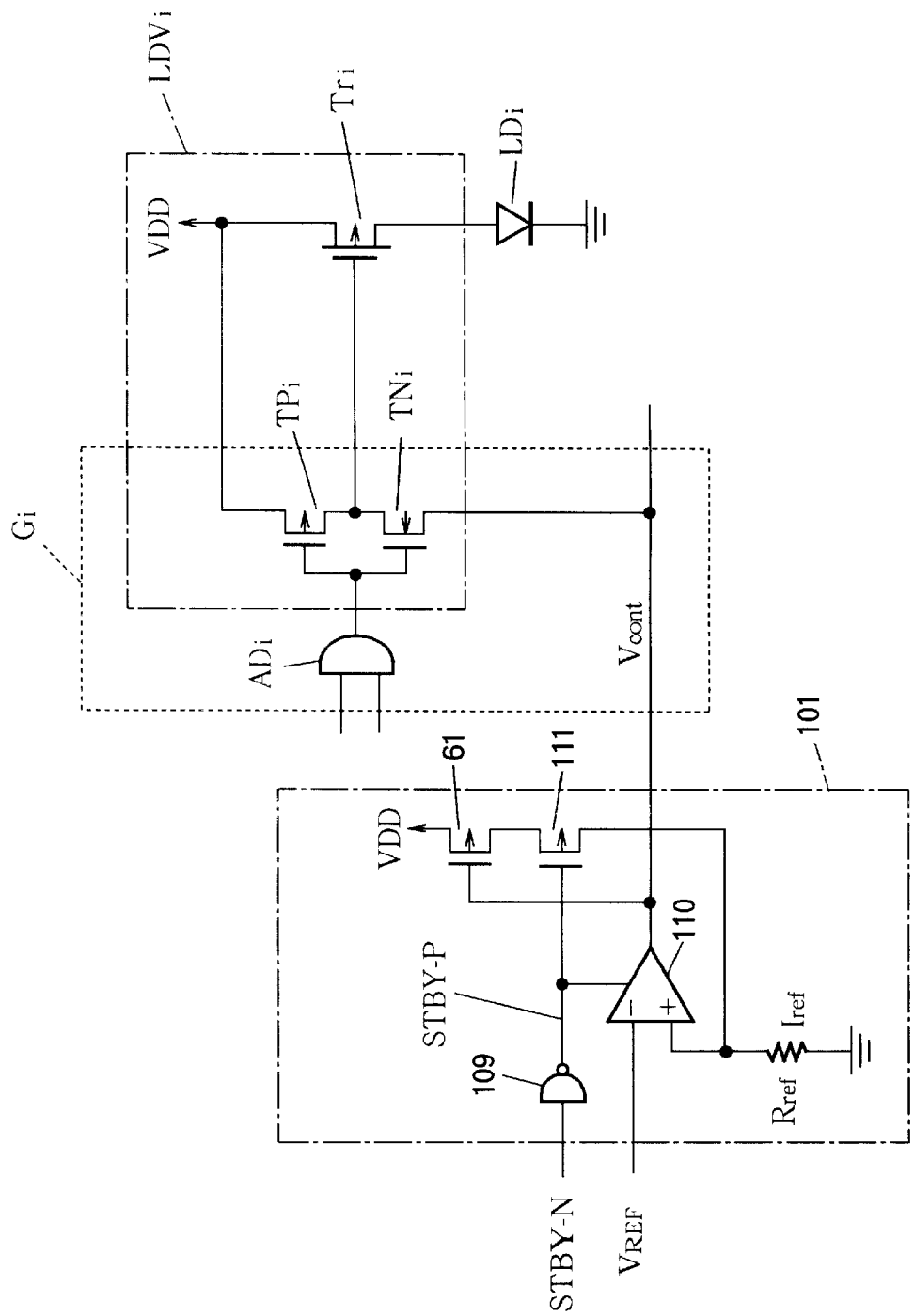
FIG. 9 is a circuit diagram illustrating the circuits for driving a light-emitting diode in the first embodiment.

FIG. 9 shows the circuits related to the driving of the i-th light-emitting diode $LD_i$. The pre-buffer circuit $G_i$ and LED driver $LDV_i$ are similar to the conventional circuits shown in FIG. 5. The control-voltage generating circuit 101 has a resistor $R_{ref}$ and PMOS transistor 61 as in the conventional control-voltage generating circuit, but also has an inverter 109 that inverts the standby mode control signal STBY-N. The resulting positive-logic standby mode control signal STBY-P is supplied to an operational amplifier 110, and to the gate electrode of a PMOS transistor 111 coupled in series between PMOS transistor 61 and resistor $R_{ref}$. The non-grounded terminal of resistor $R_{ref}$ is coupled to the drain electrode of PMOS transistor 111. The source electrode of PMOS transistor 111 is coupled to the drain electrode of PMOS transistor 61. The static current path taken by the reference current $I_{ref}$ leads from the power supply VDD through PMOS transistors 61 and 111 and resistor $R_{ref}$ to ground. PMOS transistor 111 functions as a switching element that opens this static current path in the standby mode.

The input and output terminals of the operational amplifier 110 are coupled in the conventional manner, the inverting (−) input terminal receiving the reference voltage $V_{REF}$, the non-inverting (+) input terminal being coupled to the non-grounded terminal of resistor $R_{ref}$, and the output terminal supplying the control voltage $V_{cont}$ to the pre-buffer circuit $G_i$ and the gate electrode of PMOS transistor 61.

Figure 10:
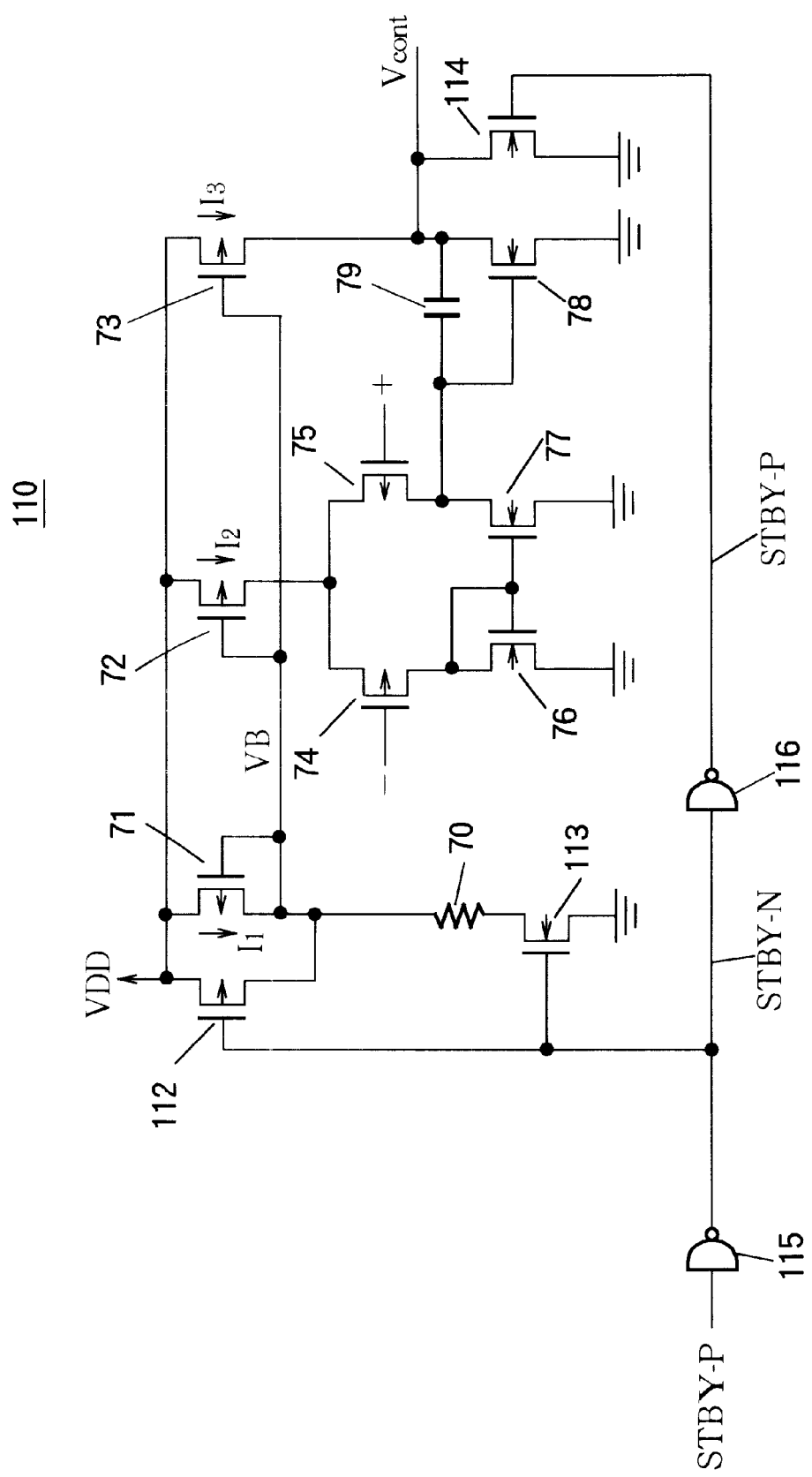
FIG. 10 is a circuit diagram illustrating the structure of the operational amplifier in FIG. 9.

FIG. 10 shows the internal structure of the operational amplifier 110. The circuit configuration differs from the conventional configuration shown in FIG. 6 in having an additional PMOS transistor 112, additional NMOS transistors 113, 114, and additional inverters 115, 116. PMOS transistor 112 and NMOS transistor 113 are switching elements that open the static current paths in the operational amplifier in the standby mode. NMOS transistor 114 holds the control voltage $V_{cont}$ at the ground level in the standby mode.

The input terminal of inverter 115 is a control-input terminal of the operational amplifier 110, receiving the standby mode control signal STBY-P from the inverter 109 shown in FIG. 9. The output terminal of inverter 115 is coupled to the gate electrodes of PMOS transistor 112 and NMOS transistor 113, and to the input terminal of inverter 116. The output terminal of inverter 116 is coupled to the gate electrode of NMOS transistor 114. The output of inverter 115 is logically equivalent to the standby mode control signal STBY-N output by the printing control unit 10. The output of inverter 116 is logically equivalent to STBY-P.

The circuit generating the bias voltage VB now includes resistor 70, PMOS transistors 71, 112, and NMOS transistor 113. PMOS transistor 112 is coupled in parallel with PMOS transistor 71, its source electrode receiving the power-supply voltage VDD and its drain electrode being coupled to resistor 70. NMOS transistor 113 is coupled in series with PMOS transistor 71 and resistor 70, between resistor 70 and ground.

The differential amplifier comprising transistors 72, 74, 75, 76, 77 has the same configuration as in the conventional driver IC.

In the output amplifier stage, NMOS transistor 114 is coupled in parallel with NMOS transistor 78, its source electrode being coupled to ground and its drain electrode being coupled to the drain electrode of PMOS transistor 73; that is, to the output terminal of the operational amplifier 110. PMOS transistor 73, NMOS transistor 78, and capacitor 79 are interconnected as in the conventional driver IC.

Inverters 109, 115, 116 in FIGS. 9 and 10 constitute a control circuit that controls the switching elements 111, 112, 113, 114.

Next, the operation of the first embodiment will be described.

Figure 11:
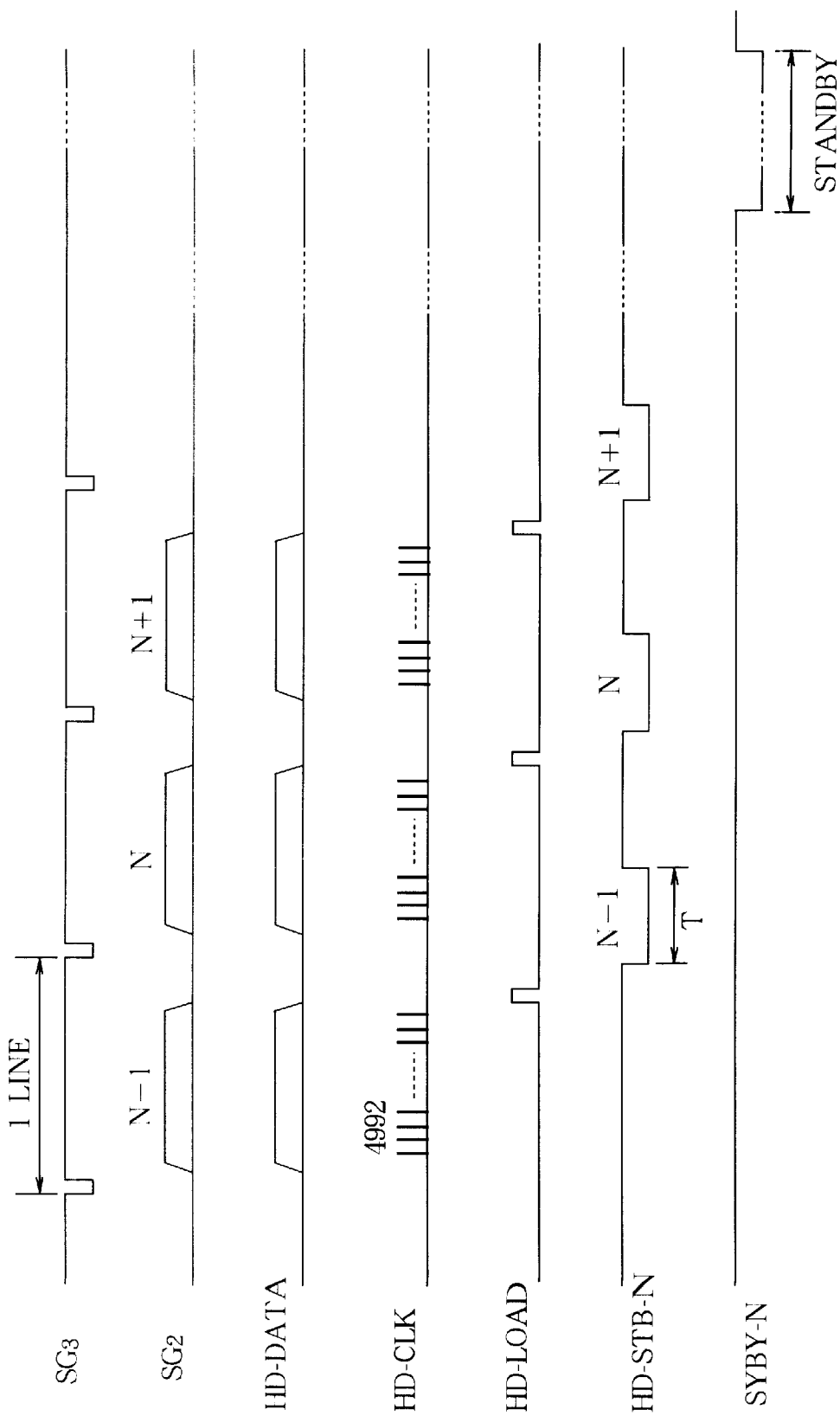
FIG. 11 is a timing diagram illustrating the operation of the first embodiment.

Referring to FIG. 11, the printing sequence involving signals $SG_3$, $SG_2$, HD-DATA, HD-CLK, HD-LOAD, and HD-STB-N is the same as in the conventional electrophotographic printer, shown in FIG. 3. Light-emitting diodes in the LED head 20 are driven according to the driving data HD-DATA while the strobe signal HD-STB-N is low. The standby mode control signal STBY-N is held inactive (high) throughout the printing sequence. In FIG. 10, PMOS transistor 112 is switched off, NMOS transistor 113 is switched on, NMOS transistor 114 is switched off, and the operational amplifier 110 operates substantially as if these transistors were not present. In FIG. 9, PMOS transistor 111 is switched on, and the operational amplifier 110 controls the control voltage $V_{cont}$ supplied to the gate electrode of PMOS transistor 61 50 as to obtain the same reference current $I_{ref}$ as in the conventional driver IC, keeping the voltage at the non-inverting (+) input terminal of the operational amplifier 110 equal to the reference voltage $V_{REF}$. The control voltage $V_{cont}$ has substantially the same value as in the conventional driver IC. In short, the modifications made to the control-voltage generating circuit 101 and operational amplifier 110 have substantially no effect on operations in the printing mode.

After completing a printing job, the printing control unit 10 gives a standby command by activating the standby mode control signal STBY-N, placing the driver ICs 100 in the standby mode. The other signals output from the printing control unit 10 to the LED head 20, including the load signal HD-LOAD, strobe signal HD-STB-N, and clock signal HD-CLK, are held inactive in the standby mode, as shown in FIG. 11.

In the standby mode, standby mode control signal STBY-P goes high in FIG. 9, switching off PMOS transistor 111, opening the static current path through this transistor, and cutting off the flow of reference current $I_{ref}$. In FIG. 10, PMOS transistor 112 switches on and NMOS transistor 113 switches off, cutting off the control current $I_1$, raising the bias voltage VB to the VDD level, and thereby switching off PMOS transistors 71, 72, 73. All three static current paths in the operational amplifier 110 are accordingly opened in the standby mode, reducing currents $I_1$, $I_2$, $I_3$ to substantially zero. In addition, NMOS transistor 114 switches on, holding the control voltage $V_{cont}$ at the ground level. As a result, the control-voltage generating circuit 101 in FIG. 9 draws substantially no standby current.

Since the strobe signal HD-STB-N is inactive in the standby mode, all light-emitting diodes are switched off. Specifically, the output of AND gate $AD_i$ in FIG. 9 is low, NMOS transistor $TN_i$ is switched off, PMOS transistor $TP_i$ is switched on, and the gate electrode of the PMOS driving transistor $Tr_i$ is held at the power-supply level (VDD), so that the driving transistor $Tr_i$ is switched off. The LED driving circuits 57 shown in FIG. 8 therefore draw substantially no standby current. The shift register 53, latching circuit 54, inverter 55, and AND logic circuit 56 are CMOS circuits which also draw substantially no current in the standby state. Total current consumption by the LED head 20 in the standby mode is only a few microamperes ($\mu$A).

During the standby mode, if the printing control unit 10 receives a printing command $SG_1$ from the higher-order controller, it switches the standby mode control signal STBY-N to the inactive (high) level and returns to the printing mode.

The very low current drawn by the LED head 20 in the standby mode enables even stringent requirements on standby power consumption to be met easily.

In addition, when a driver IC 100 receives a low standby mode control signal STBY-N, its quiescent current consumption becomes substantially zero. A quiescent-current test can accordingly be carried out by holding the STBY-N input terminal at the active (low) level, and holding other input terminals at the inactive level. The driver IC 100 can thus be tested efficiently and inexpensively.

2nd EMBODIMENT

The second embodiment is similar to the first embodiment, but uses the load and strobe signals to give the standby command, thereby dispensing with the need for a separate standby mode control signal line.

Figure 12:
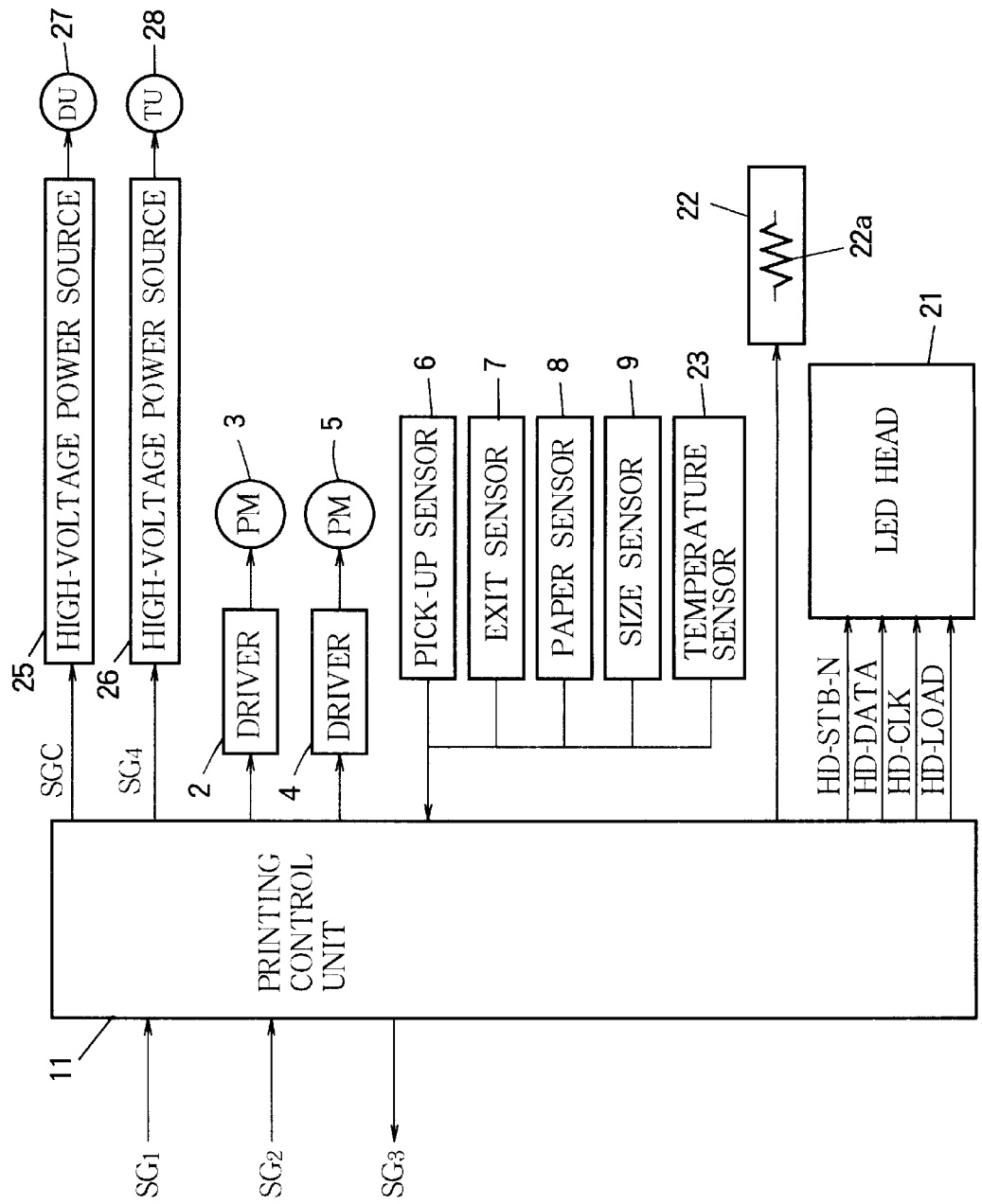
FIG. 12 is a block diagram of an electrophotographic printer illustrating a second embodiment of the invention.

Referring to FIG. 12, the second embodiment is an electrophotographic printer with the conventional configuration, but with modifications to the printing control unit 11 and LED head 21. The modification to the printing control unit 11 consists in driving both the load signal and strobe signal to the active level (HD-LOAD high and HD-STB-N low) in the standby mode.

Figure 13:
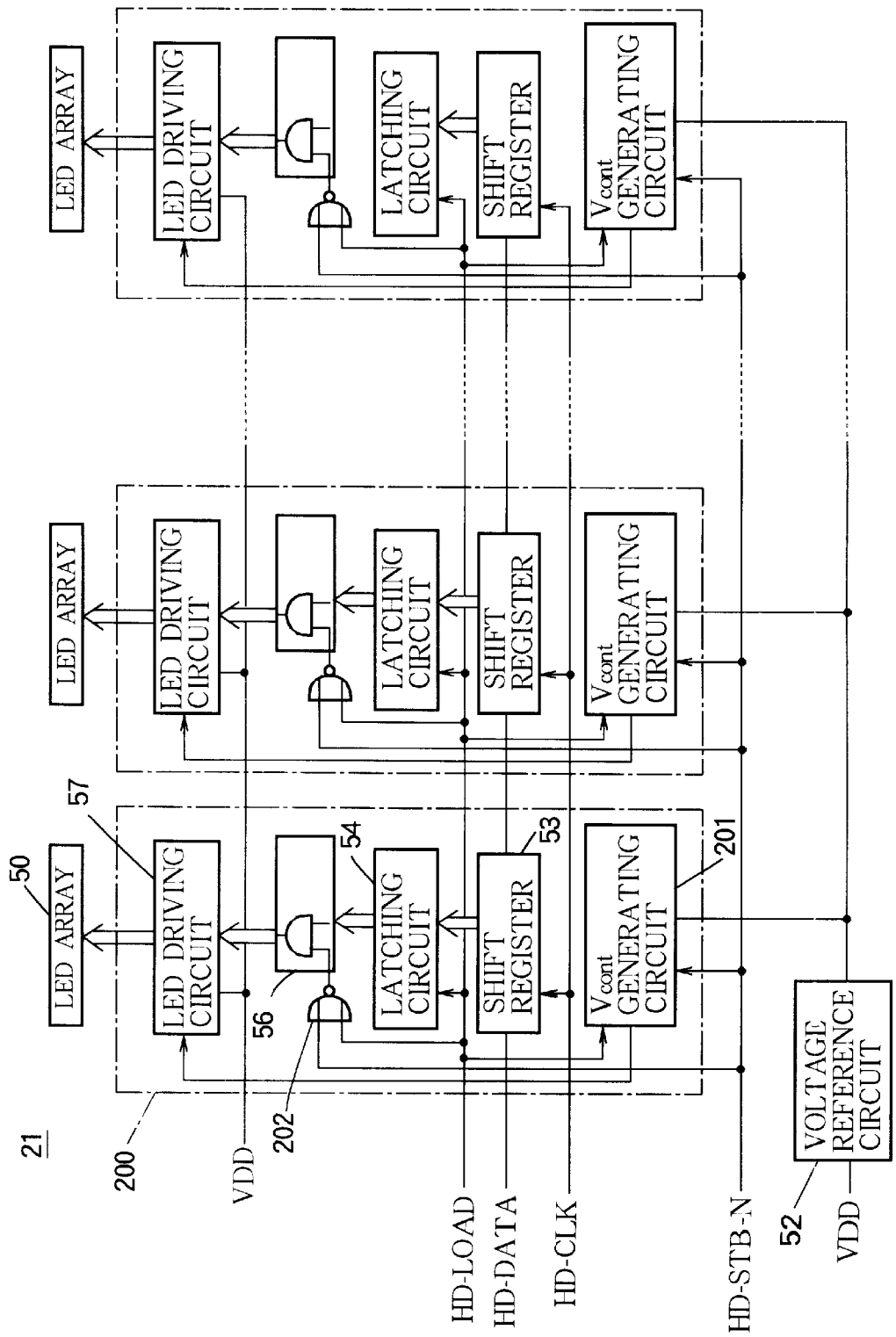
FIG. 13 is a block diagram illustrating the structure of the LED head in FIG. 12.

FIG. 13 shows the internal structure of the LED head 21, comprising twenty-six conventional LED array chips 50, a conventional voltage reference circuit 52, and twenty-six driver ICs 200. Each driver IC 200 comprises a conventional shift register 53, latching circuit 54, AND logic circuit 56, and LED driving circuit 57, a modified control-voltage generating circuit 201, and a NOR gate 202. The NOR gate 202 receives the load signal HD-LOAD and strobe signal HD-STB-N. The output terminal of the NOR gate 202 is coupled to the AND logic circuit 56. The control-voltage generating circuit 201 also receives the load signal HD-LOAD and strobe signal HD-STB-N, as well as the reference voltage $V_{REF}$.

Figure 14:
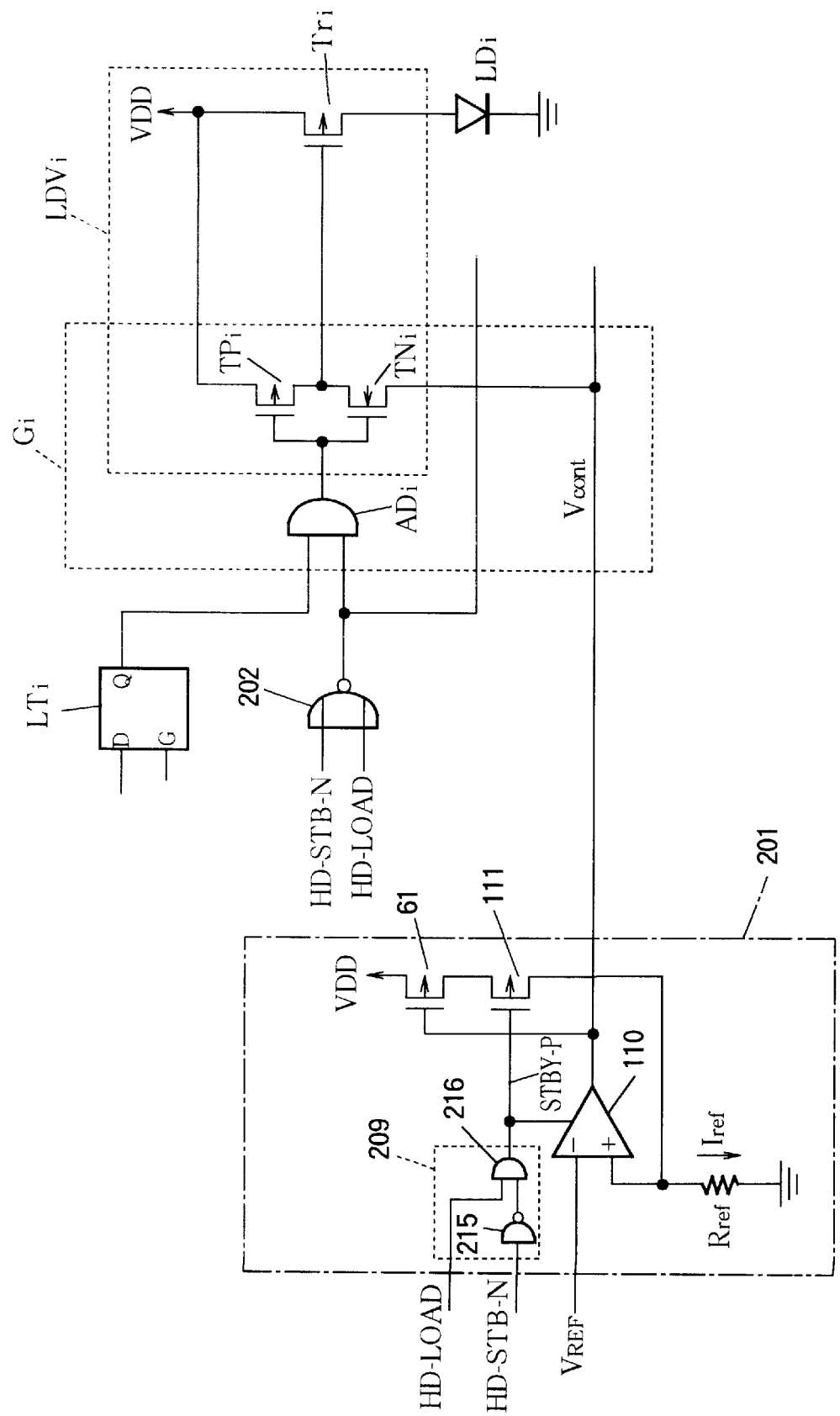
FIG. 14 is a circuit diagram illustrating the circuits for driving a light-emitting diode in the second embodiment.

FIG. 14 shows the circuits related to the driving of the i-th light-emitting diode $LD_i$. The pre-buffer circuit $G_i$ and LED driver $LDV_i$ are similar to the conventional circuits shown in FIG. 5. One input terminal of the AND gate $AD_i$ is coupled to the Q output terminal of latch $LT_i$. The other input terminal of AND gate $AD_i$ receives the output of the NOR gate 202. The control-voltage generating circuit 201 has the same resistor $R_{ref}$, PMOS-transistor 61, operational amplifier 110, and PMOS transistor 111 as in the first embodiment, and a standby mode control circuit 209. The standby mode control circuit 209 comprises an inverter 215 that inverts the strobe signal HD-STB-N, and an AND gate 216 that receives the output of inverter 215 and the load signal HD-LOAD. The output of AND gate 216, which is logically equivalent to standby mode control signal STBY-P in the first embodiment, is coupled to the operational amplifier 110 and the gate electrode of PMOS transistor 111. In the second embodiment, STBY-P is active when HD-LOAD and HD-STB-N are both active, and inactive at other times.

Figure 15:
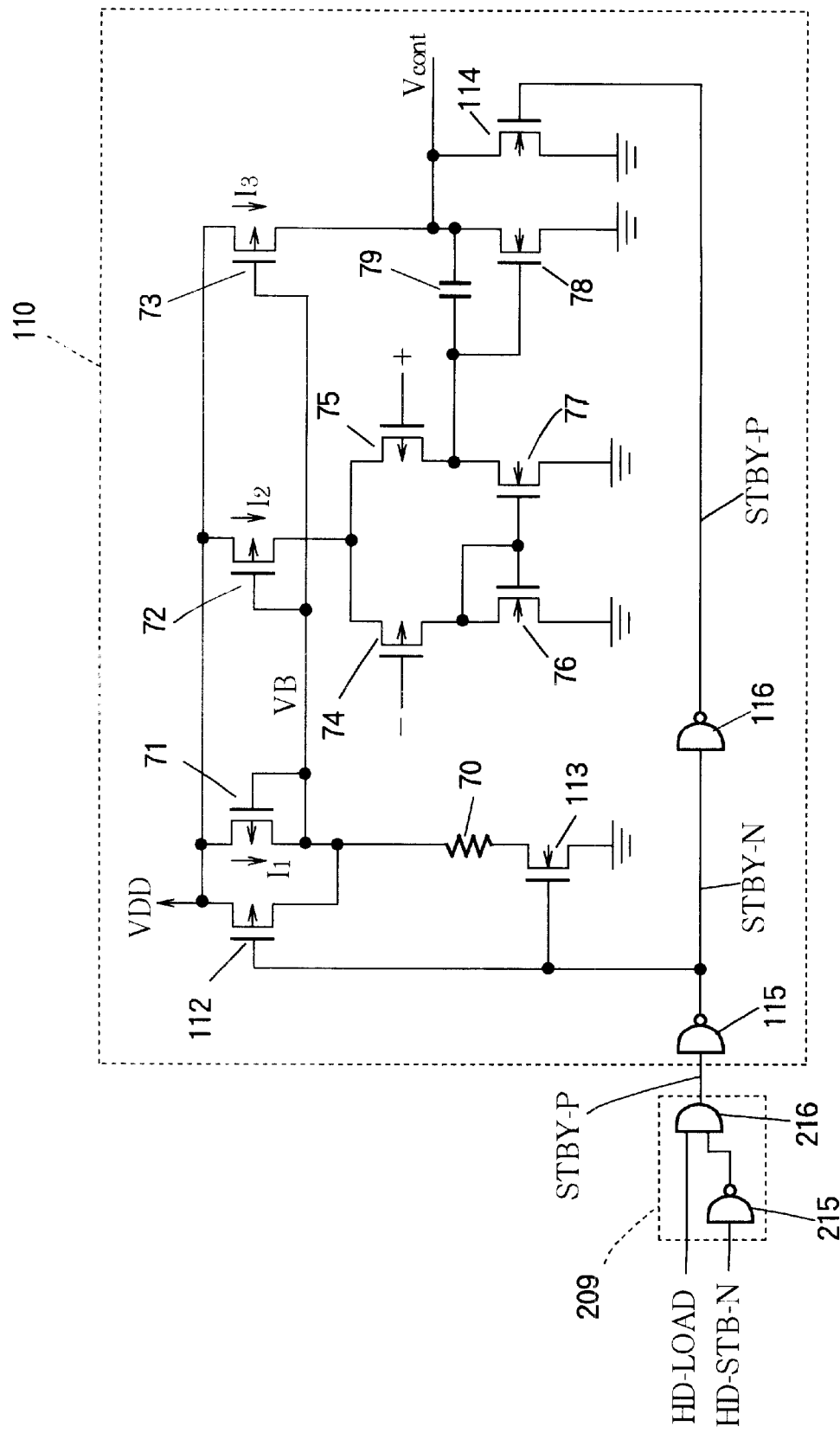
FIG. 15 is a circuit diagram of the operational amplifier and standby mode control circuit in FIG. 14.

FIG. 15 shows the interconnection between the standby mode control circuit 209 and operational amplifier 110 in more detail. The operational amplifier 110 has the internal structure described in the first embodiment, including inverters 115 and 116. The standby mode control signal STBY-P output by the standby mode control circuit 209 is coupled to the input terminal of inverter 115. The output of inverter 115 is logically equivalent to STBY-N in the first embodiment.

Next, the operation of the second embodiment will be described.

Figure 16:
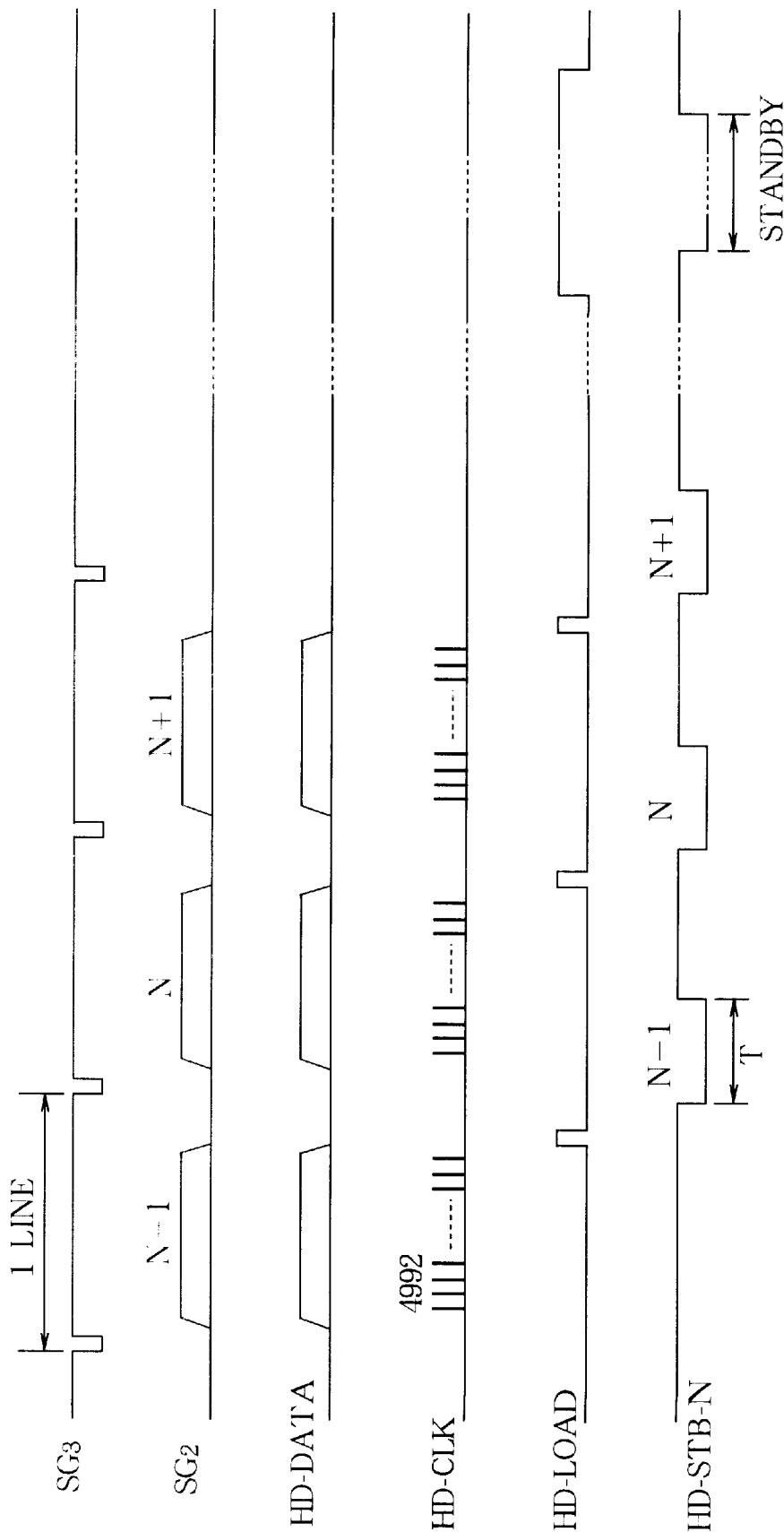
FIG. 16 is a timing diagram illustrating the operation of the second embodiment.

Referring to FIG. 16, the printing sequence in the second embodiment is identical to the conventional printing sequence. Driving data HD-DATA are latched in the conventional manner when the load signal HD-LOAD goes high. Light-emitting diodes are driven according to the driving data when HD-LOAD and HD-STB-N are both low, making the outputs of NOR gates 202 in FIG. 13 high. During the printing sequence, HD-LOAD and HD-STB-N are never active simultaneously, so the standby mode control signal STBY-P output by the standby mode control circuit 209 in FIG. 14 remains inactive (low), as it was during the printing sequence in the first embodiment. Printing operations in the second embodiment are identical to the printing operations in the first embodiment.

To enter the standby mode, the printing control unit 11 first activates the load signal HD-LOAD and leaves it active (high), as shown at the right in FIG. 16. As long as HD-LOAD remains high, the outputs of the NOR gates 202 in FIG. 13 remain low, all outputs of the AND logic circuits 56 remain low, and no light-emitting diodes are driven. Next, the printing control unit 11 activates the strobe signal HD-STB-N. The standby mode control signal STBY-P output by the standby mode control circuit 209 in FIG. 14 now goes high, so PMOS transistor 111 in FIG. 14 is switched off, transistors 71, 72, 73, and 113 in FIG. 15 are switched off, transistors 112 and 114 are switched on, the reference current $I_{ref}$ in FIG. 14 and currents $I_1, I_2, I_3$ in FIG. 15 are cut off, and the control voltage $V_{cont}$ is held at ground level, as in the first embodiment.

If the printing control unit 10 receives a printing command $SG_1$ from the higher-order controller during the standby mode, it returns the strobe signal HD-STB-N to the high level, then drives the load signal HD-LOAD low, as shown in FIG. 16, returning both signals to the inactive state in preparation for the next printing sequence. The second embodiment provides the same effects as the first embodiment, reducing standby power consumption of the printer and enabling quiescent-current testing of the driver ICs, but the second embodiment does not require an extra signal line between the printing control unit 11 and LED head 21. The driver ICs 200 in the second embodiment can have the conventional number of input-output terminals. The second embodiment enables the invention to be practiced without increased interconnection costs or wire-bonding costs, and without increasing the size of the driver ICs.

3rd EMBODIMENT

The third embodiment combines the standby control scheme of the second embodiment with a known scheme for compensating for differing electrical characteristics of the light-emitting diodes and their driving transistors. The combination of the load and strobe signals is used both for loading compensation data into the LED head, and for designating the standby mode.

In the electrophotographic printers described so far, since all of the light-emitting diodes are strobed for the same length of time, any differences in the electrical characteristics of the driving transistors $Tr_1$ to $Tr_{4992}$ or light-emitting diodes $LD_1$ to $LD_{4992}$ cause dot-illumination differences. These illumination differences lead to differences in the size of printed dots, because dots that receive more light attract more toner. The dot-size irregularities are not readily visible in printed text, but when natural images or other images with shades of gray are printed, the irregularities show up as seams or lines, degrading the quality of the printed output. To avoid these printing irregularities, printers designed for high-quality printing vary the driving current supplied to the individual light-emitting diodes, to compensate for the different electrical characteristics.

Figure 17:
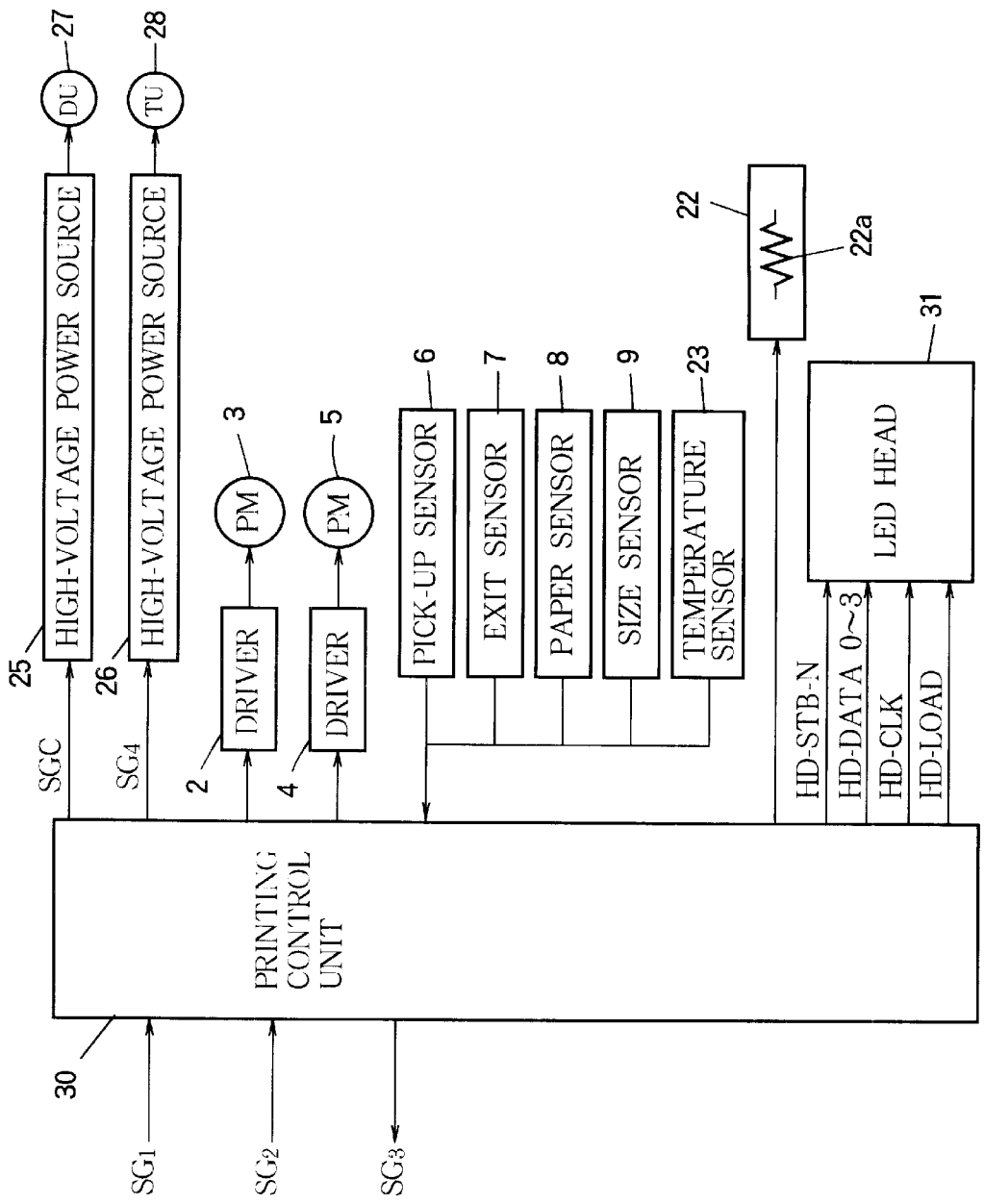
FIG. 17 is a block diagram of an electrophotographic printer illustrating a third embodiment of the invention.

Referring to FIG. 17, the third embodiment differs from the second embodiment in regard to the printing control unit 30 and LED head 31. One of the differences is that the printing control unit 30 supplies driving data to the LED head 31 in four-bit parallel form, on four HD-DATA signal lines, numbered from zero to three. Another difference is that the printing control unit 30 includes a non-volatile memory such as an electrically erasable programmable read-only memory (EEPROM, not visible) storing compensation data.

Figure 18:
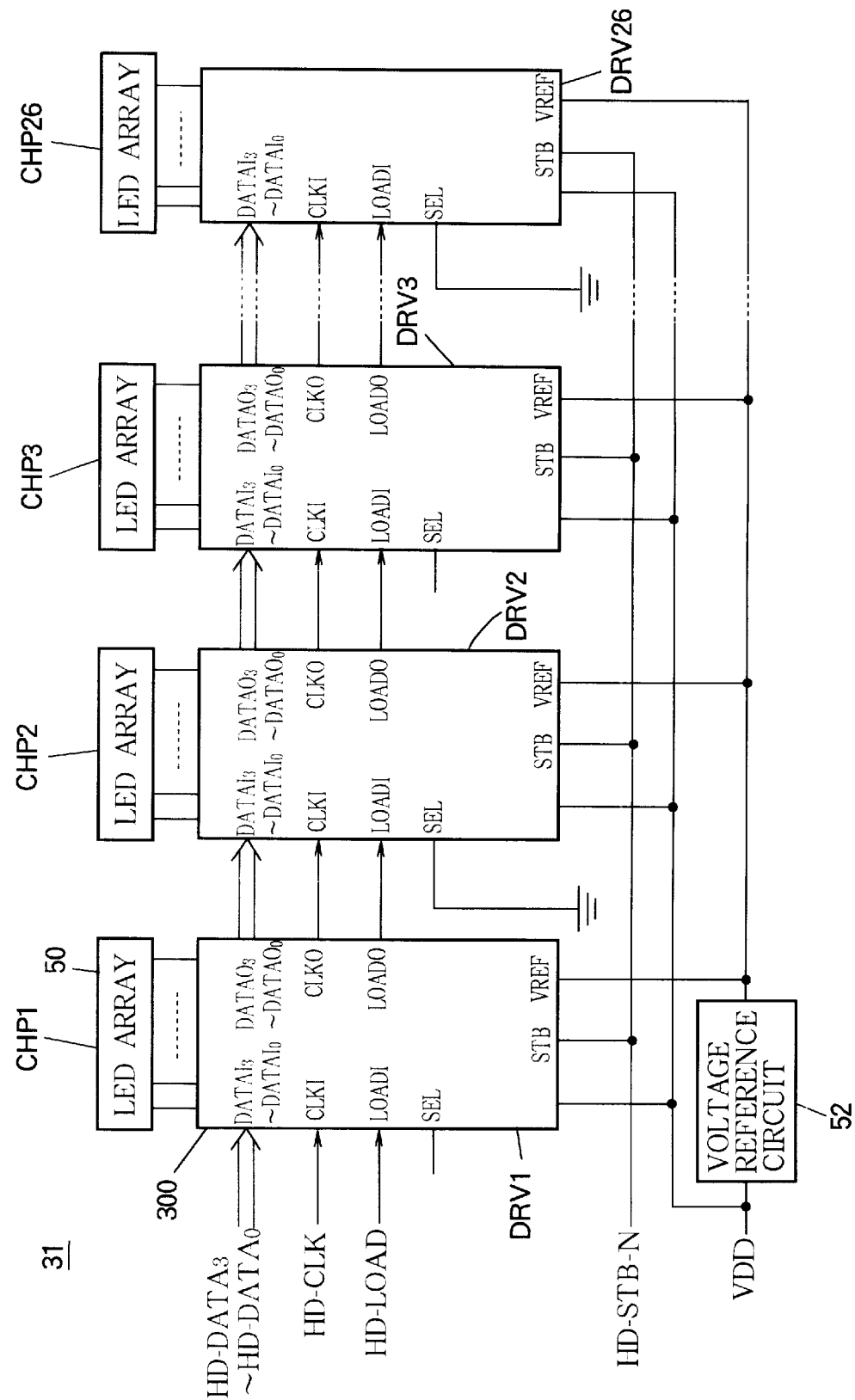
FIG. 18 is a block diagram illustrating the structure of the LED head in FIG. 17.

FIG. 18 shows the internal structure of the LED head 31, comprising twenty-six conventional LED array chips 50, a conventional voltage reference circuit 52, and twenty-six driver ICs 300. Each driver IC 300 drives the light-emitting diodes in the corresponding LED array chip 50 by supplying compensated driving currents, so that all of the light-emitting diodes deliver substantially the same optical power. Besides having input terminals $DATAI_0$ to $DATAI_3$, CLKI, LOADI, STB, and VREF for the driving data signals $HD-DATA_0$ to $HD-DATA_3$, clock signal HD-CLK, load signal HD-LOAD, strobe signal HD-STB-N, and reference voltage signal $V_{REF}$, each driver IC 300 has a select input terminal SEL. Each driver IC 300 also has output terminals $DATAO_0$ to $DATAO_3$, CLKO, and LOADO for the driving data signals, clock signal, and load signal.

The driving data signals $HD-DATA_0$ to $HD-DATA_3$, clock signal HD-CLK, and load signal HD-LOAD supplied by the printing control unit 30 are received by the first driver IC (DRV1). For values of m from one to twenty-five, the output terminals of driver IC DRVm are coupled to the corresponding input terminals of the next driver IC DRV(m+1), so that the driving data signals, clock signal, and load signal are passed from one driver IC 300 to another until they reach the last driver IC (DRV26). The strobe signal HD-STB-N and reference voltage $V_{REF}$ are received in parallel by all of the driver ICs (DRV1 to DRV26).

Figure 19:
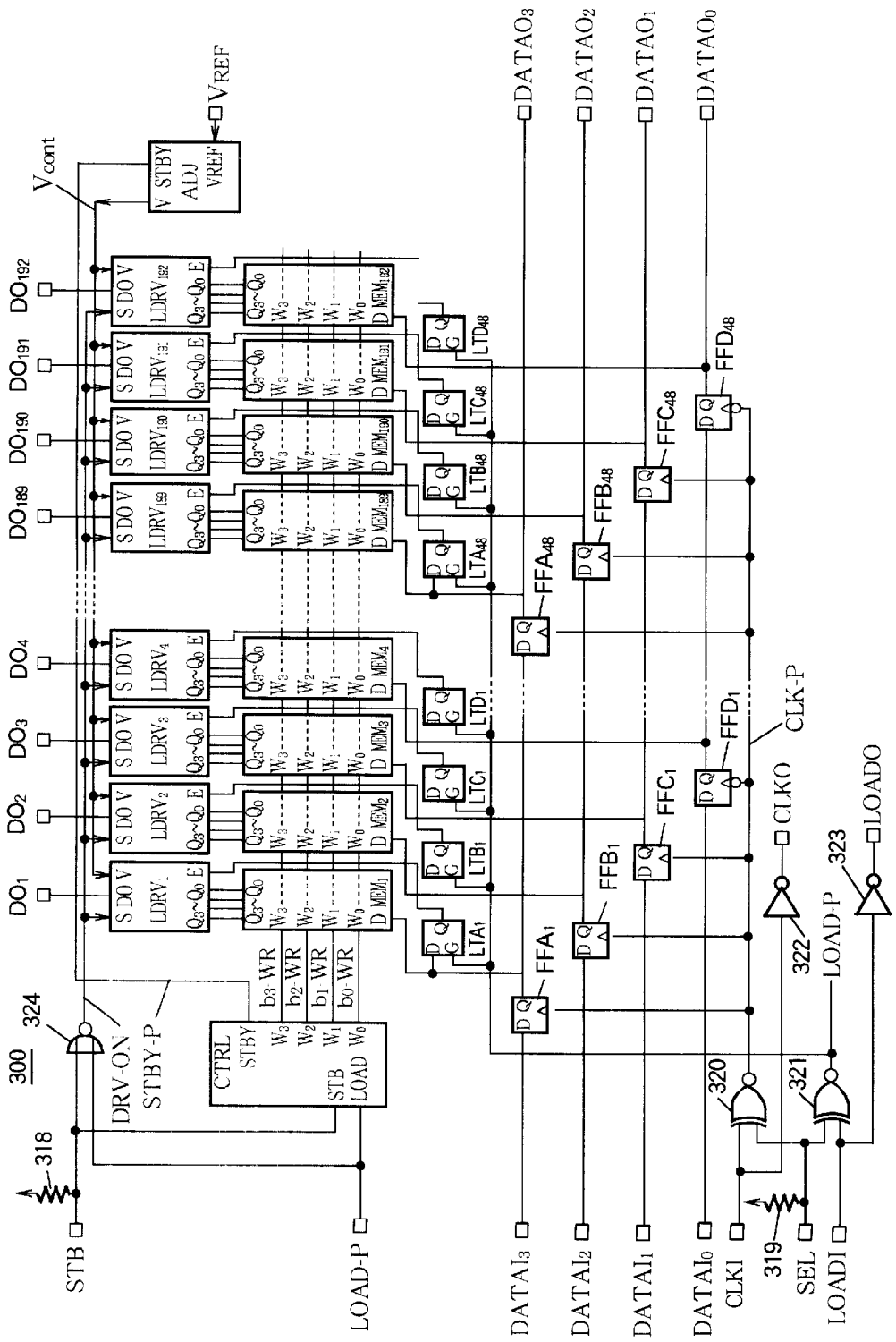
FIG. 19 is a circuit diagram illustrating the structure of a driver IC in FIG. 18.

Each driver IC 300 has the internal structure shown in FIG. 19, comprising one hundred ninety-two flip-flops $FFA_1$ to $FFA_{48}$, $FFB_1$ to $FFB_{48}$, $FFC_1$ to $FFC_{48}$, and $FFD_1$ to $FFD_{48}$, corresponding latches $LTA_1$ to $LTA_{48}$, $LTB_1$ to $LTB_{48}$, $LTC_1$ to $LTC_{48}$, and $LTD_1$ to $LTD_{48}$, one hundred ninety-two memory circuits $MEM_1$ to $MEM_{192}$, corresponding drive output circuits $LDRV_1$ to $LDRV_{192}$, a control circuit CTRL, a control-voltage generating circuit ADJ, pull-up resistors 318, 319, exclusive-NOR gates 320, 321, inverters 322, 323, and a NOR gate 324, as well as the input and output terminals noted above. Also provided are drive output terminals $DO_1$ to $DO_{192}$, which are coupled to the anodes of respective light-emitting diodes in an LED array chip 50.

The strobe input terminal STB is coupled through pull-up resistor 318 to the power supply VDD, and is thereby pulled up to the high logic level if not connected. The select input terminal SEL is similarly pulled up by pull-up resistor 319.

The select input terminal SEL is coupled to input terminals of exclusive-NOR gates 320 and 321. The clock input terminal CLKI is coupled to the other input terminal of exclusive-NOR gate 320, and through inverter 322 to the clock output terminal CLKO. The load input terminal LOADI is coupled to the other input terminal of exclusive-NOR gate 321, and through inverter 323 to the load output terminal LOADO. Each time the clock and load signals are passed from the input terminals to the output terminals of a driver IC 300, they are inverted by inverters 322 and 323. Inverting the clock and load signals as they pass through each driver IC prevents a difference between rise and fall times from causing a cumulative increase or decrease in the pulse width of these signals. The exclusive-NOR gates 320 and 321 compensate for the inversion, generating clock and load signals CLK-P and LOAD-P of the correct polarity for internal use in each driver IC 300.

As shown in FIG. 18, the select input terminals SEL of the even-numbered driver ICs DRV2, DRV4, . . . , DRV26 are grounded, causing the exclusive-NOR gates 320, 321 in FIG. 19 to invert the clock and load signals. The select input terminals SEL of the odd-numbered driver ICs DRV1, DRV3, . . . , DRV25 are left unconnected and are thus at the high logic level, causing exclusive-NOR gates 320, 321 to pass the clock and load signals without inverting them. As a result, in all driver ICs 300, the clock signal CLK-P output by exclusive-NOR gate 320 and the load signal LOAD-P output by exclusive-NOR gate 321 have the same polarity as the HD-CLK and HD-LOAD signals output by the printing control unit 30.

Clock signal CLK-P is coupled to the clock input terminal of each of the flip-flops $FFA_1$ to $FFD_{48}$. The data input terminals $DATAI_3$, $DATAI_2$, $DATAI_1$, $DATAI_0$ are coupled to the data (D) input terminals of flip-flops $FFA_1$, $FFB_1$, $FFC_1$, $FFD_1$, respectively. The Q output terminals of flip-flops $FFA_m$, $FFB_m$, $FFC_m$, $FFD_m$ are coupled to the data input terminals of flip-flops $FFA_{m+1}$, $FFB_{m+1}$, $FFC_{m+1}$, $FFD_{m+1}$, respectively, for values of m from one to forty-seven. The Q output terminals of flip-flops $FFA_{48}$, $FFB_{48}$, $FFC_{48}$, $FFD_{48}$ are coupled to the data output terminals $DATAO_3$, $DATAO_2$, $DATAO_1$, $DATAO_0$, respectively. The flip-flops are thus cascaded to form four parallel shift registers, each having forty-eight stages.

Since the data output terminals ($DATAO_3$ to $DATAO_0$) of one driver IC 300 are coupled to the data input terminals ($DATAI_3$ to $DATAI_0$) of the next driver IC, the flip-flops in the twenty-six driver ICs 300 combine to form four parallel shift registers with twelve thousand forty-eight stages each (1248=48×26). The parallel shift-register structure reduces the number of clock cycles needed for transferring one dot line by a factor of four (1248=4992/4). The shift registers are also used to transfer compensation data into the memory circuits. Use of the same shift registers for two purposes reduces the number of necessary input and output terminals, thereby reducing the size of the driver ICs, and reduces the number of wire-bonding interconnections necessary between the driver ICs.

The Q output terminals of flip-flops $FFA_m$, $FFB_m$, $FFC_m$, $FFD_m$ are coupled to the data input terminals of latches $LTA_m$, $LTB_m$, $LTC_m$, $LTD_m$, respectively, for values of m from one to forty-eight. The load signal LOAD-P output by exclusive-NOR gate 321 is coupled to the gating input terminals of all of the latches $LTA_m$, $LTB_m$, $LTC_m$, $LTD_m$. The latches receive the data output by the flip-flops when the load signal LOAD-P is high, latch the received data when LOAD-P goes low, and retain the latched data until LOAD-P goes high again.

The Q output terminals of flip-flops $FFA_m$, $FFB_m$, $FFC_m$, $FFD_m$ are coupled to the data (D) input terminals of corresponding memory circuits. The Q output terminal of flip-flop $FFA_1$ is coupled to the D input terminal of memory circuit $MEM_1$, the Q output terminal of flip-flop $FFB_1$ is coupled to the D input terminal of memory circuit $MEM_2$, and so on, the Q output terminal of flip-flop $FFD_{48}$ being coupled to the D input terminal of memory circuit $MEM_{192}$.

Each memory circuit $ME^ML$ also has four memory-cell select input terminals $W_0$, $W_1$, $W_2$, $W_3$ that receive write control signals $b_0$-WR, $b_1$-WR, $b_2$-WR, $b_3$-WR output by the control circuit CTRL, and four output terminals $Q_0$, $Q_1$, $Q_2$, $Q_3$ that are coupled to the corresponding drive output circuit $LDRV_n$.

Figure 20:
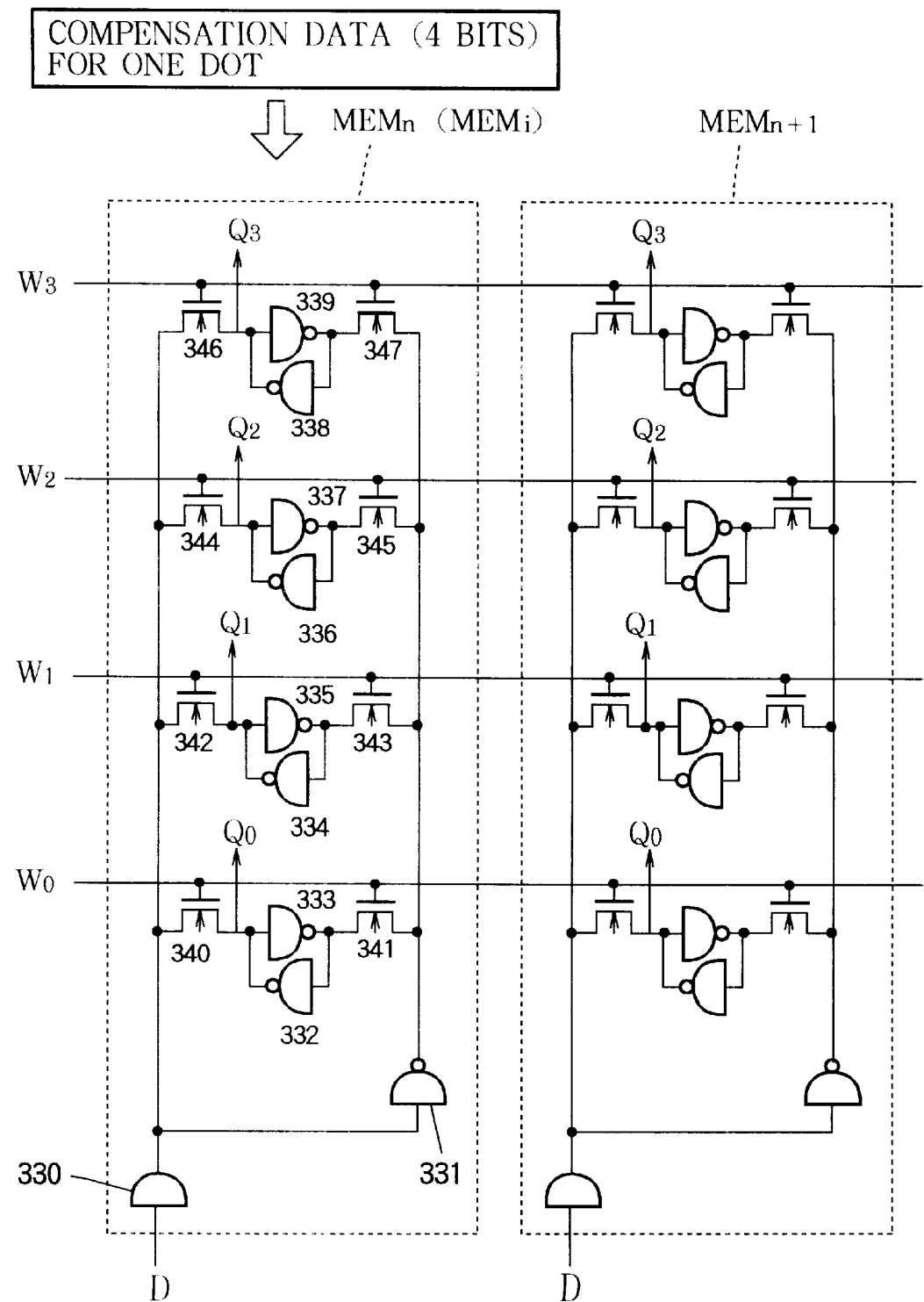
FIG. 20 is a circuit diagram illustrating the structure of the memory circuits in FIG. 19.

FIG. 20 shows the internal structure of a pair of memory circuits $MEM_n$ and $MEM_{n+1}$, where n is an arbitrary integer from one to one hundred ninety-one. All of the memory circuits have the same internal structure; the memory circuit associated with the i-th light-emitting diode $LD_i$ will also be referred to below as $MEM_i$, where i is an arbitrary integer from one to four thousand nine hundred ninety-two.

Memory circuit $MEM_i$ comprises a buffer circuit 330, inverters 331 to 339, and NMOS transistors 340 to 347. The data input terminal D is coupled to the input terminal of the buffer circuit 330. Memory-cell select input terminal $W_0$ is coupled to the gate electrodes of NMOS transistors 340 and 341. Memory-cell select input terminal $W_1$ is coupled to the gate electrodes of NMOS transistors 342 and 343. Memory-cell select input terminal $W_2$ is coupled to the gate electrodes of NMOS transistors 344 and 345. Memory-cell select input terminal $W_3$ is coupled to the gate electrodes of NMOS transistors 346 and 347.

The source and drain electrodes of NMOS transistors 340 to 347 will be referred to below as first and second electrodes, since either electrode can function as the source and either as the drain. The output terminal of the buffer circuit 330 is coupled to the first electrodes of NMOS transistors 340, 342, 344, 346, and to the input terminal of inverter 331. The output terminal of inverter 331 is coupled to the first electrodes of NMOS transistors 341, 343, 345, 347.

Inverters 332 and 333 are coupled to form a one-bit static memory cell, the input terminal of each of these two inverters being coupled to the output terminal of the other inverter. Inverters 334 and 335, inverters 336 and 337, and inverters 338 and 339 are similarly coupled to form one-bit memory cells.

The input terminal of inverter 333 is coupled to output terminal $Q_0$ and the second electrode of NMOS transistor 340. Similarly, the input terminals of inverters 335, 337, 339 are coupled to output terminals $Q_1$, $Q_2$, $Q_3$ and the second electrodes of NMOS transistor 342, 344, 346. The output terminals of inverters 333, 335, 337, 339 are coupled to the second electrodes of NMOS transistors 341, 343, 345, 347, respectively.

Memory circuit $MEM_1$ stores four bits of compensation data, denoted $b_0$, $b_1$, $b_2$, $b_3$, for light-emitting diode $LD_i$. All four bits are transferred into the memory circuit through the data input terminal D. The write control signals $b_0$-WR, $b_1$-WR, $b_2$-WR, $b_3$-WR select the memory cell in which each bit is stored.

When write control signal $b_0$-WR is high, for example, NMOS transistors 340 and 341 are switched on, and the bit received at the data input terminal D is written into the memory cell formed by inverters 332 and 333. Similarly, the received bit is written into the memory cell formed by inverters 334 and 335 when $b_1$-WR is high, the memory cell formed by inverters 334 and 335 when $b_2$-WR is high, and the memory cell formed by inverters 334 and 335 when $b_3$-WR is high. The data stored in the memory cells are always output at the output terminals $Q_0$, $Q_1$, $Q_2$, $Q_3$ Referring again to FIG. 19, the output terminals $Q_0$, $Q_1$, $Q_2$, $Q_3$ of the memory circuits are coupled to corresponding input terminals $Q_0$, $Q_1$, $Q_2$, $Q_3$ of the drive output circuits $LDRV_1$ to $LDRV_{192}$. Each drive output circuit also has an E input terminal that receives the data stored in the corresponding latch, an S input terminal that receives a drive control signal DRV-ON from the NOR gate 324, a V input terminal that receives a control voltage $V_{cont}$ from the control-voltage generating circuit ADJ, and a drive output terminal DO coupled to the corresponding output terminal $DO_i$ of the driver IC 300.

Figure 21:
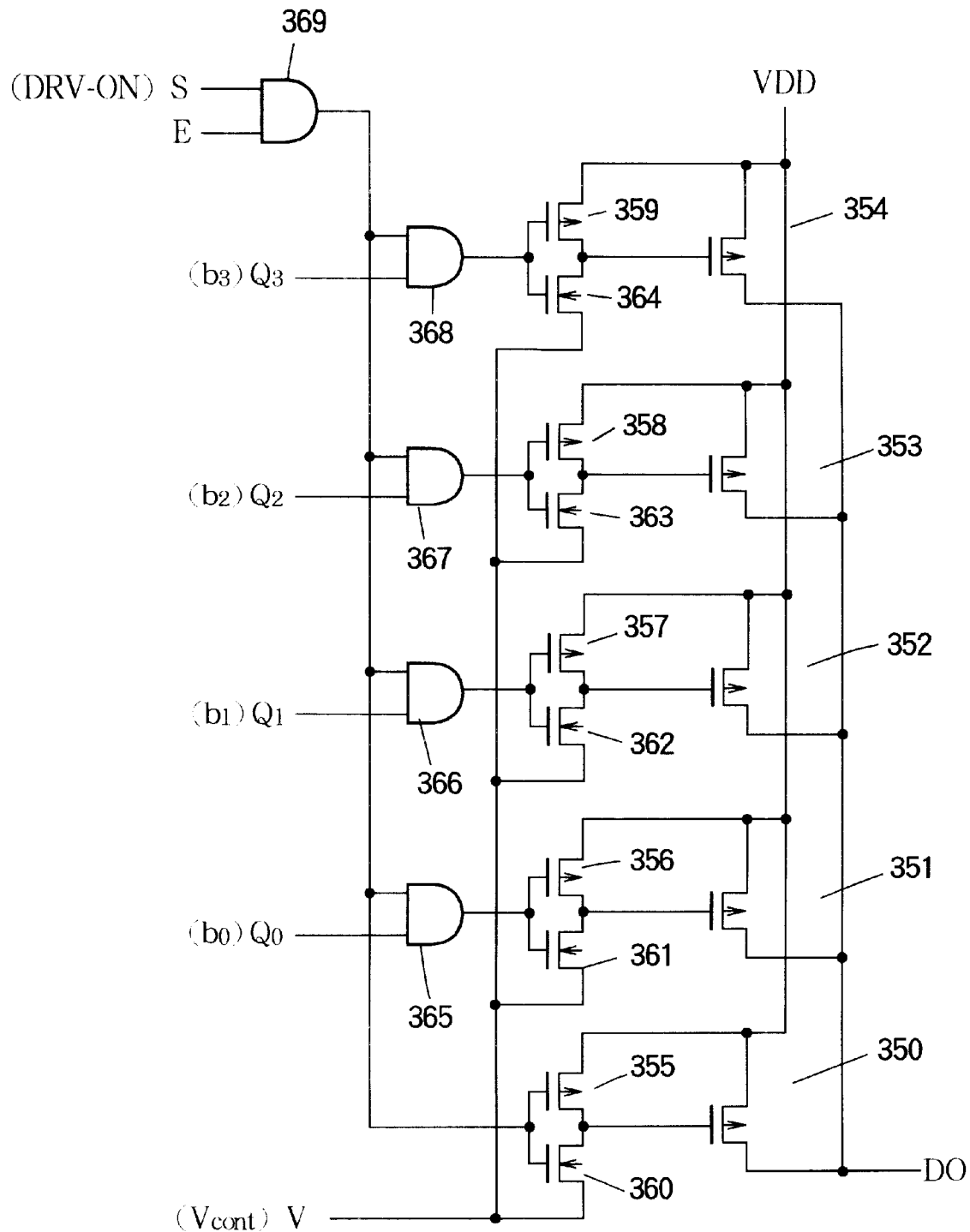
FIG. 21 is a circuit diagram illustrating the structure of the drive output circuits in FIG. 19.

FIG. 21 shows the internal structure of a drive output circuit $LDRV_i$, comprising PMOS transistors 350 to 359, NMOS transistors 360 to 364, and AND gates 365 to 369. AND gate 369 receives the drive control signal (DRV-ON) from input terminal S and one bit of driving data from input terminal E. The output terminal of AND gate 369 is coupled to one input terminal of each of the AND gates 365, 366, 367, 368. The other input terminals of these AND gates 365, 366, 367, 368 are coupled to input terminals $Q_0$, $Q_1$, $Q_2$, $Q_3$, respectively.

PMOS transistor 355 and NMOS transistor 360 form an inverter that inverts the output of AND gate 369 and drives PMOS transistor 350. The gate electrodes of PMOS transistor 355 and NMOS transistor 360 are both coupled to the output terminal of AND gate 369. The source electrode of PMOS transistor 355 is coupled to the power supply VDD. The source electrode of NMOS transistor 360 is coupled to the V input terminal. The drain electrodes of PMOS transistor 355 and NMOS transistor 360 are both coupled to the gate electrode of PMOS transistor 350. Accordingly, when the output of AND gate 369 is low, the gate electrode of PMOS transistor 350 is at the VDD potential, and PMOS transistor 350 is switched off. When the output of AND gate 369 is high, the gate electrode of PMOS transistor 350 is at the $V_{cont}$ potential, and PMOS transistor 350 is switched on.

Similarly, PMOS transistors 356, 357, 358, 359 and NMOS transistors 361, 362, 363, 364 form inverters that invert the outputs of AND gates 365, 366, 367, 368 and drive PMOS transistors 351, 352, 353, 354, supplying $V_{cont}$ when the AND outputs are high.

POS transistors 350 to 354 are driving transistors that collectively correspond to transistor $Tr_i$ in FIG. 9. The source electrodes of these transistors 350 to 354 are coupled in parallel to the power supply VDD; their drain electrodes are coupled in parallel to the drive output terminal DO. PMOS transistor 350 is the main driving transistor. PMOS transistors 351 to 354 are auxiliary driving transistors that supply additional driving current to adjust the total driving current. The gate widths of PMOS transistors 354, 353, 352, 351 are in the ratio 8:4:2:1.

When the drive control signal DRV-ON is low, the outputs of all AND gates 365 to 369 are low, and the driving transistors 350 to 355 are all switched off. Similarly, if the bit of driving data received at the E input terminal is low, all AND-gate outputs are low and the driving transistors are all switched off.

When the drive control signal DRV-ON is high, if the driving data bit received at the E input terminal is also high, then the main driving transistor 350 is switched on and supplies current to the drive output terminal DO. The auxiliary driving transistors 351, 352, 353, 354 are switched on or off depending on the values of the bits $b_0$, $b_1$, $b_2$, $b_3$ received at input terminals $Q_0$, $Q_1$, $Q_2$, $Q_3$. The amount of driving current supplied by the auxiliary driving transistors is proportional to the gate widths of these transistors, so the total driving current is adjustable in sixteen equal steps according to the value of bits $b_0$, $b_1$, $b_2$, $b_3$. The total driving current also depends on the control voltage $V_{cont}$.

Referring again to FIG. 19, the control circuit CTRL has a load input terminal that receives the load signal LOAD-P from exclusive-NOR gate 321, a strobe (STB) input terminal that receives the strobe signal HD-STB-N from the STB input terminal of the driver IC 300, output terminals $W_0$, $W_1$, $W_2$, $W_3$ for the write control signals $b_0$-WR, $b_1$-WR, $b_2$-WR, $b_3$-WR, and a standby (STBY) output terminal from which a standby mode control signal STBY-P is sent to the control-voltage generating circuit ADJ.

Figure 22:
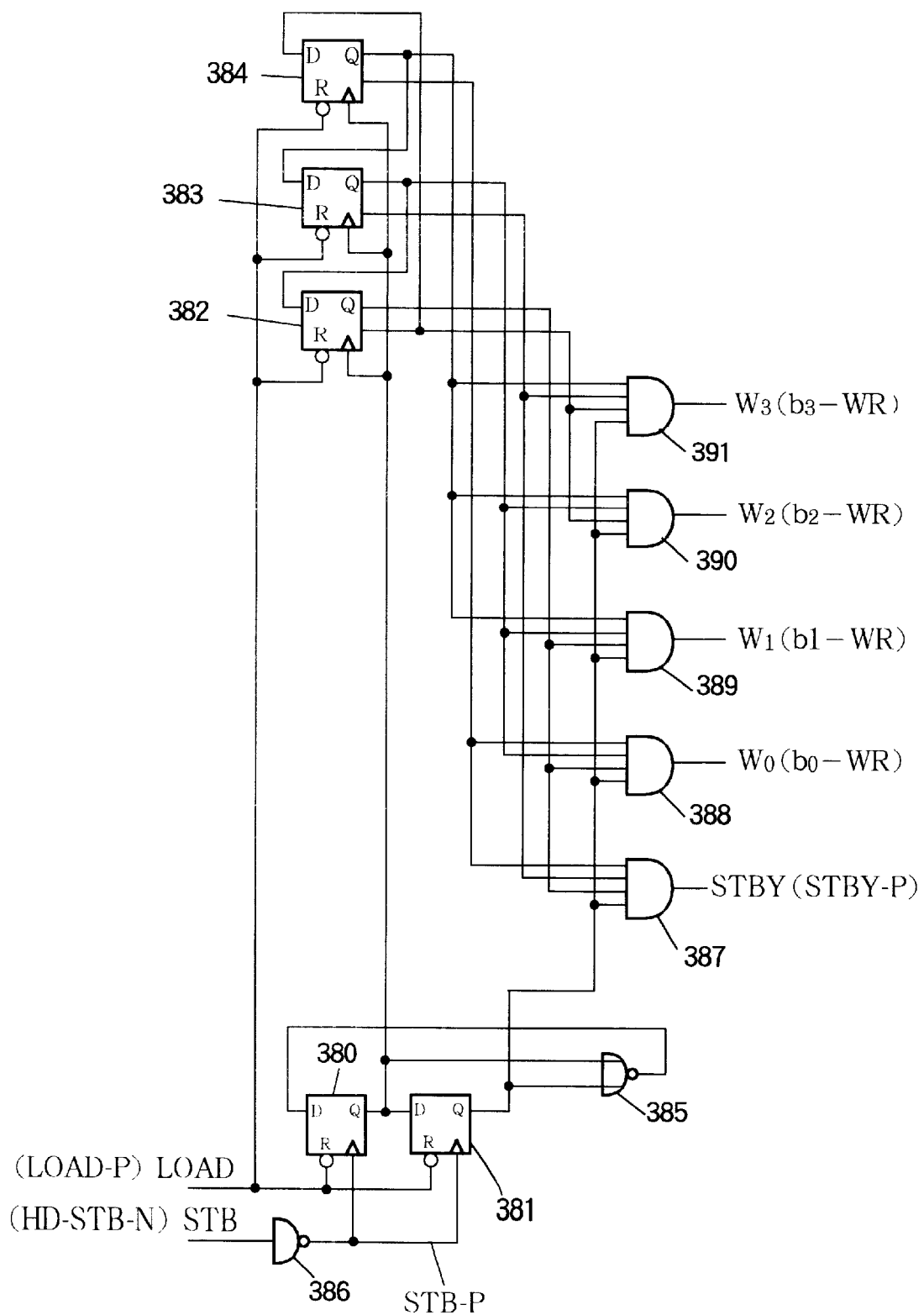
FIG. 22 is a circuit diagram illustrating the structure of the control circuit in FIG. 19.

FIG. 22 shows the internal structure of the control circuit CTRL, comprising flip-flops 380 to 384, a NOR gate 385, an inverter 386, and four-input AND gates 387 to 391. Inverter 386 is coupled to the STB input terminal, and inverts the strobe signal HD-STB-N to generate a positive-logic strobe signal STB-P. The flip-flops 380 to 384 have respective reset (R) terminals that receive the load signal LOAD-P. When LOAD-P is low, the non-inverting (Q) output terminals of all of the flip-flops 380 to 384 are held at the low logic level.

Flip-flops 380 and 381 and NOR gate 385 are interconnected to form a ring counter. When LOAD-P is high, this counter is incremented by rising transitions of the strobe signal STB-P output by inverter 386. The data input terminal D of flip-flop 380 is coupled to the output terminal of NOR gate 385. The data output terminal Q of flip-flop 380 is coupled to the data input terminal D of flip-flop 381, and to one input terminal of NOR gate 385. The data output terminal Q of flip-flop 381 is coupled to the other input terminal of NOR gate 385.

Flip-flops 382, 383, 384 are interconnected to form a Johnson counter. When LOAD-P is high, this counter is incremented by rising transitions of the signal output from flip-flop 380 in the ring counter. The data input terminal D of flip-flop 382 is coupled to the non-inverting output terminal Q of flip-flop 383. The data input terminal D of flip-flop 383 is coupled to the non-inverting output terminal Q of flip-flop 384. The data input terminal D of flip-flop 384 is coupled to the inverting output terminal of flip-flop 382.

AND gates 387 to 391 decode the outputs of flip-flops 381 to 384, as follows.

The four input terminals of AND gate 387 are coupled to the non-inverting (Q) output terminals of flip-flops 381 and 382, and the inverting output terminals of flip-flops 383 and 384. The output of AND gate 387 is the standby mode control signal STBY-P, which is supplied to the STBY output terminal.

The four input terminals of AND gate 388 are coupled to the non-inverting output terminals of flip-flops 381, 382, 383, and the inverting output terminal of flip-flop 384. The output of AND gate 388 is write control signal $b_0$-WR, which is supplied to output terminal $W_0$.

The four input terminals of AND gate 389 are coupled to the non-inverting output terminals of flip-flops 381, 382, 383, 384. The output of AND gate 389 is write control signal $b_1$-WR, which is supplied to output terminal $W_1$.

The four input terminals of AND gate 390 are coupled to the non-inverting output terminals of flip-flops 381, 383, 384, and the inverting output terminal of flip-flop 382. The output of AND gate 390 is write control signal $b_2$-WR, which is supplied to output terminal $W_2$.

The four input terminals of AND gate 391 are coupled to the non-inverting (Q) output terminals of flip-flops 381, 384, and the inverting output terminals of flip-flops 382, 383. The output of AND gate 391 is the write control signal $b_3$-WR, which is supplied to output terminal $W_3$.

The counters and decoding circuits are configured so that if strobe pulses are supplied while the load signal is active, output signals $b_3$-WR, $b_2$-WR, $b_1$-WR, $b_0$-WR, and STBY-P are activated in turn at intervals of three strobe pulses, each output signal remaining active for one strobe cycle.

Referring again to FIG. 19, the control-voltage generating circuit ADJ has a reference-voltage (VREF) input terminal coupled to the $V_{REF}$ input terminal of the driver IC 300, a standby (STBY) input terminal receiving the standby mode control signal STBY-P output by the control circuit CTRL, and a V output terminal that supplies the control voltage $V_{cont}$ to the V input terminals of the drive output circuits.

Figure 23:
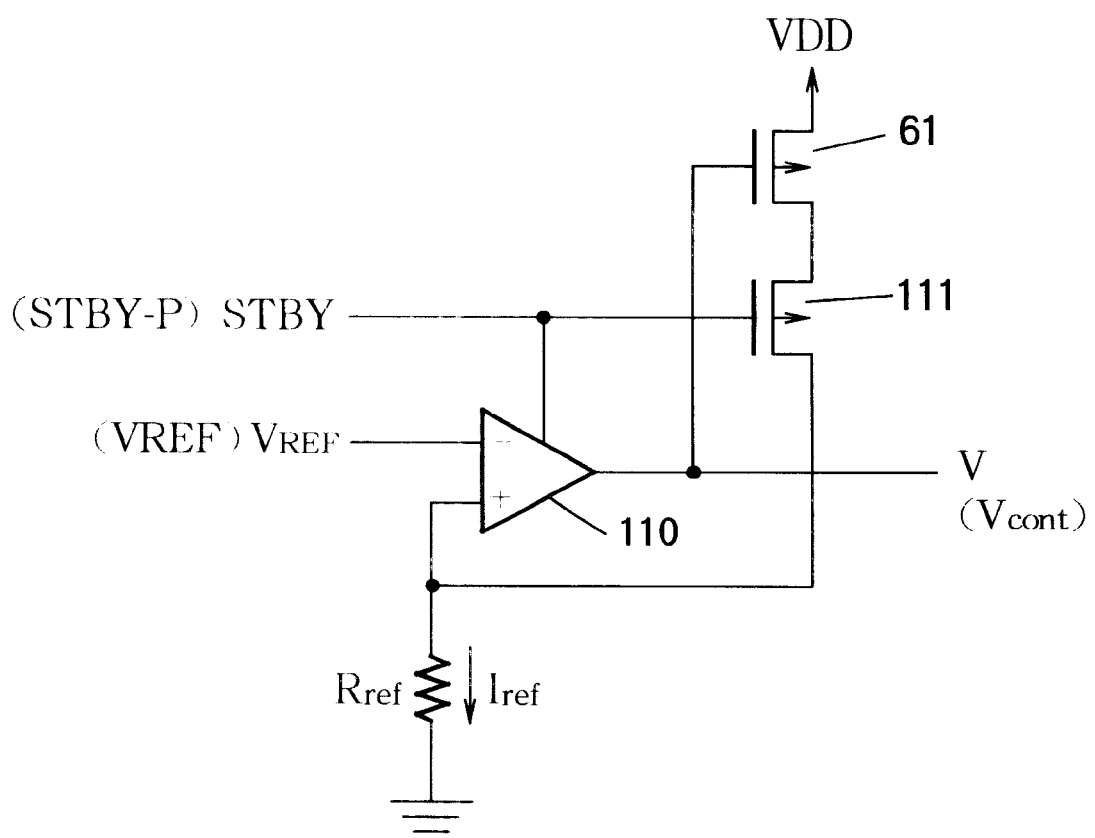
FIG. 23 is a circuit diagram illustrating the structure of the control-voltage generating circuit in FIG. 19.

FIG. 23 shows the internal structure of the control-voltage generating circuit ADJ. As in the first and second embodiments, PMOS transistors 61 and 111 and a resistor $R_{ref}$ are coupled in series between the power supply VDD and ground. An operational amplifier 110 supplies the control voltage $V_{cont}$ to output terminal V and to the gate electrode of PMOS transistor 61. The non-inverting (+) input terminal of the operational amplifier is coupled to a point between resistor $R_{ref}$ and PMOS transistor 111. The inverting (−) input terminal of the operational amplifier receives the reference voltage $V_{REF}$ from the reference-voltage (VREF) input terminal. The standby mode control signal STBY-P is supplied from the STBY input terminal to the operational amplifier 110 and to the gate electrode of PMOS transistor 111.

The operational amplifier 110 has the same internal structure as in the first and second embodiments, shown in FIG. 10.

Next, the operation of the third embodiment will be described. In the third embodiment, before printing takes place, the printing control unit 30 stores compensation data in the memory circuits of the LED head 31. After storing the compensation data, if no printing command is received immediately, the printing control unit 30 commands the LED head 31 to enter the standby mode. When a printing command is received, the printing control unit 30 exits the standby mode and begins the conventional printing sequence. When the printing job ends, if no following printing command is received, the printing control unit 30 again stores the compensation data in the memory circuits of the LED head 31 and places the LED head 31 in the standby mode.

Figure 24:
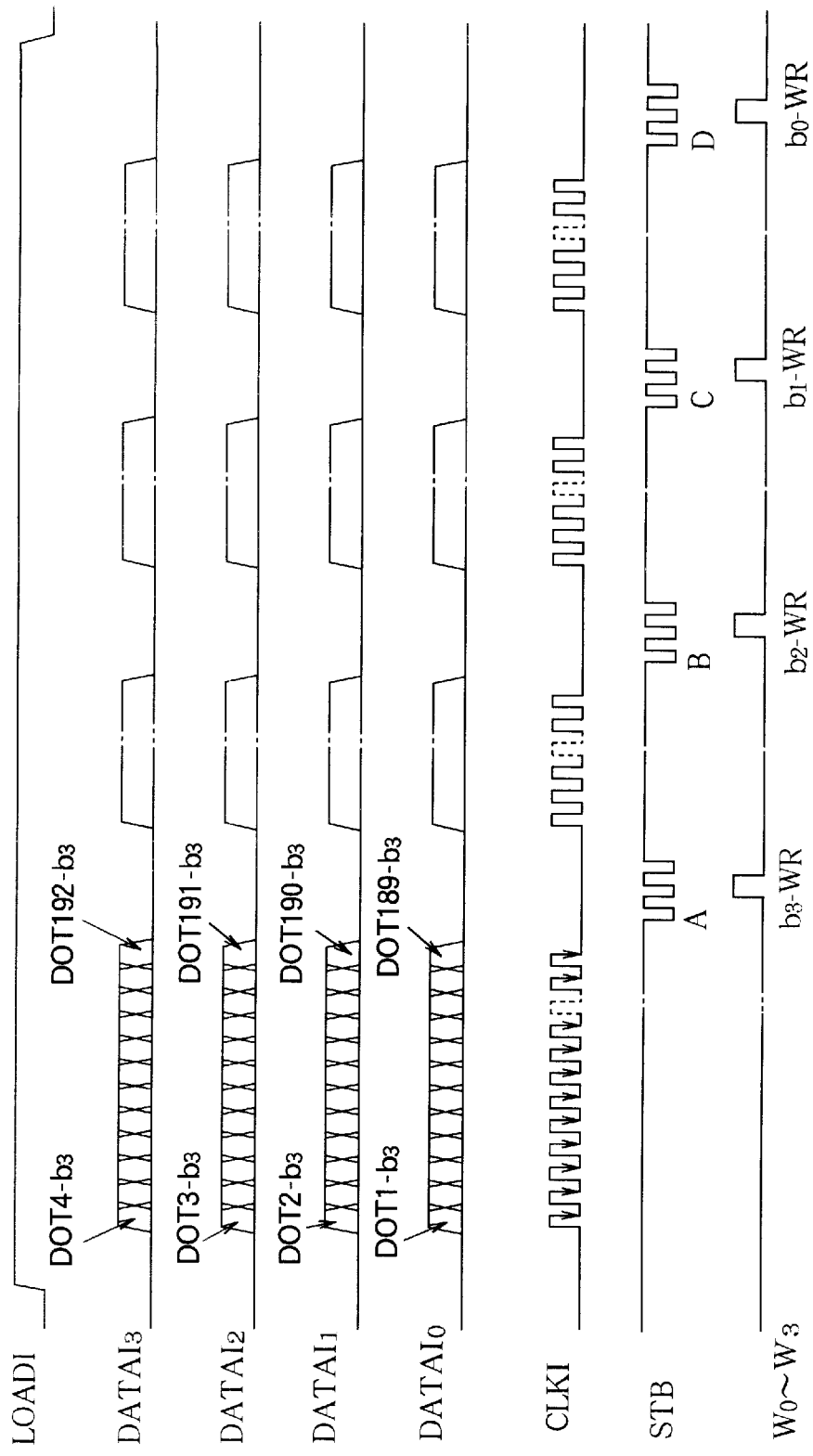
FIG. 24 is a timing diagram illustrating the loading of compensation data in the third embodiment.

For simplicity, FIG. 24 illustrates the storing of compensation data into a single driver IC 300, the select input (SEL) of which is high or unconnected, so that the internal load signal LOAD-P and clock signal CLK-P have the same polarity as the signals received at the LOADI and CLKI input terminals. Initially, all inputs are in the inactive state, and since LOAD-P is low, the outputs of all flip-flops in the control circuit CTRL in FIG. 22 are low.

To begin loading compensation data, the LOADI input terminal is driven high, causing the internal load signal LOAD-P to go high. Next, one hundred ninety-two bits of compensation data DOT1-$b_3$ to DOT192-$b_3$, comprising bit $b_3$ for each drive output circuit, are supplied to the data input terminals $DATAI_0$, $DATAI_1$, $DATAI_2$, $DATAI_3$ in synchronization with the falling transitions of forty-eight clock pulses at the clock input terminal CLKI. These bits are shifted into the four shift registers comprising flip-flops $FFA_1$ to $FFD_{48}$.

Next, three low pulses (A) are supplied to the strobe input terminal STB. At the first of these three pulses, the outputs of flip-flops 380 and 384 in the control circuit CTRL (FIG. 22) go high. At the second pulse, the output of flip-flop 380 goes low and the output of flip-flop 381 goes high, causing AND gate 391 to active write control signal $b_3$-WR. The compensation data DOTI-$b_3$ to DOT192-$b_3$ are thereby written simultaneously into the memory cells coupled to the $W_3$ input terminals of memory circuits $MEM_1$ to $MEM_{192}$. At the third pulse, the output of flip-flop 381 goes low and the write control signal $b_3$-WR is deactivated, leaving the compensation data stored in the memory cells.

Another one hundred ninety-two bits of compensation data ($b_2$) are now transferred in synchronization with forty-eight clock pulses, followed by three more low strobe pulses (B). The counters in the control circuit CTRL are incremented, AND gate 390 activates write control signal $b_2$-WR, and the compensation data are stored in the memory cells coupled to the $W_2$ input terminals in the memory circuits $MEM_1$ to $MEM_{192}$.

Next, the $b_1$ compensation bits are transferred, and stored in the memory cells coupled to the $W_1$ terminals by three more strobe pulses (C), which activate write control signal $b_1$-WR. Then the $b_0$ compensation bits are transferred and stored in the memory cells coupled to the $W_0$ terminals by another three strobe pulses (D), which activate write control signal $b_0$-WR. At the end of these operations the load input terminal LOADI is returned to the low level.

Figure 25:
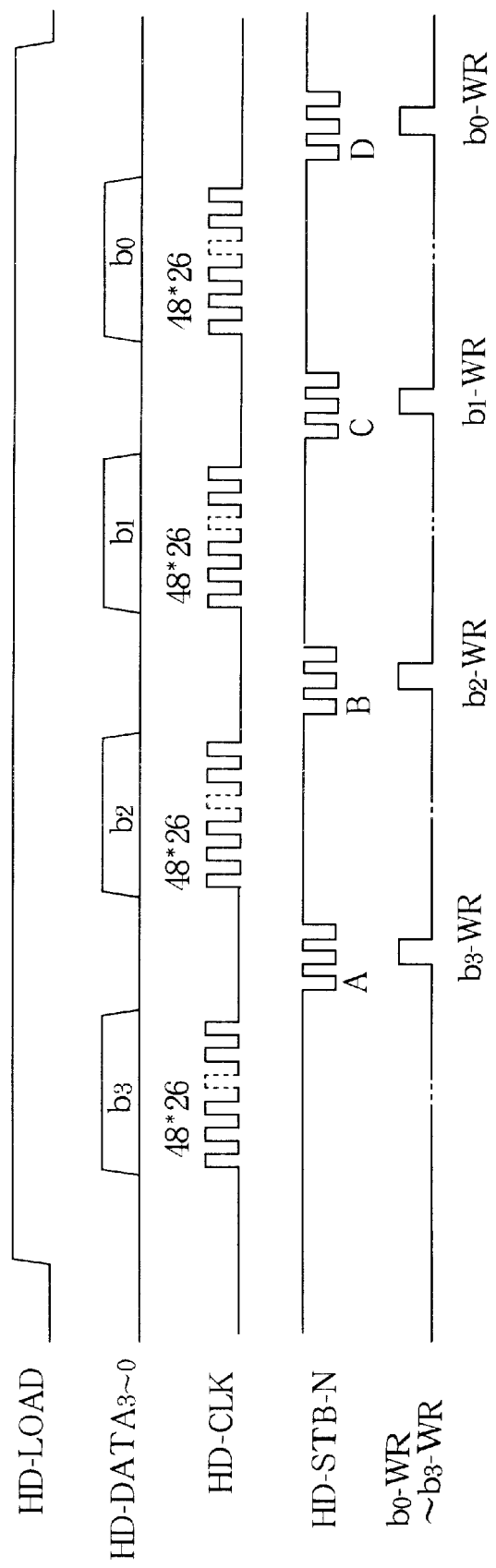
FIG. 25 is another timing diagram illustrating the loading of compensation data in the third embodiment.

FIG. 25 illustrates the storing of compensation data in the twenty-six driver ICs 300 of the LED head 31, showing waveforms of the signals (HD-LOAD, $HD-DATA_0$ to $HD-DATA_3$, HD-CLK, and HD-STB-N) output by the printing control unit 30 and waveforms of the write control signals ($b_0$-WR to $b_3$-WR) generated in the control circuits CTRL. The only difference between this operation and the operation in FIG. 25 is that the printing control unit 30 generates twelve thousand forty-eight clock pulses (1248= 48×26) before each group of three strobe pulses (A, B, C, D).

Figure 26:
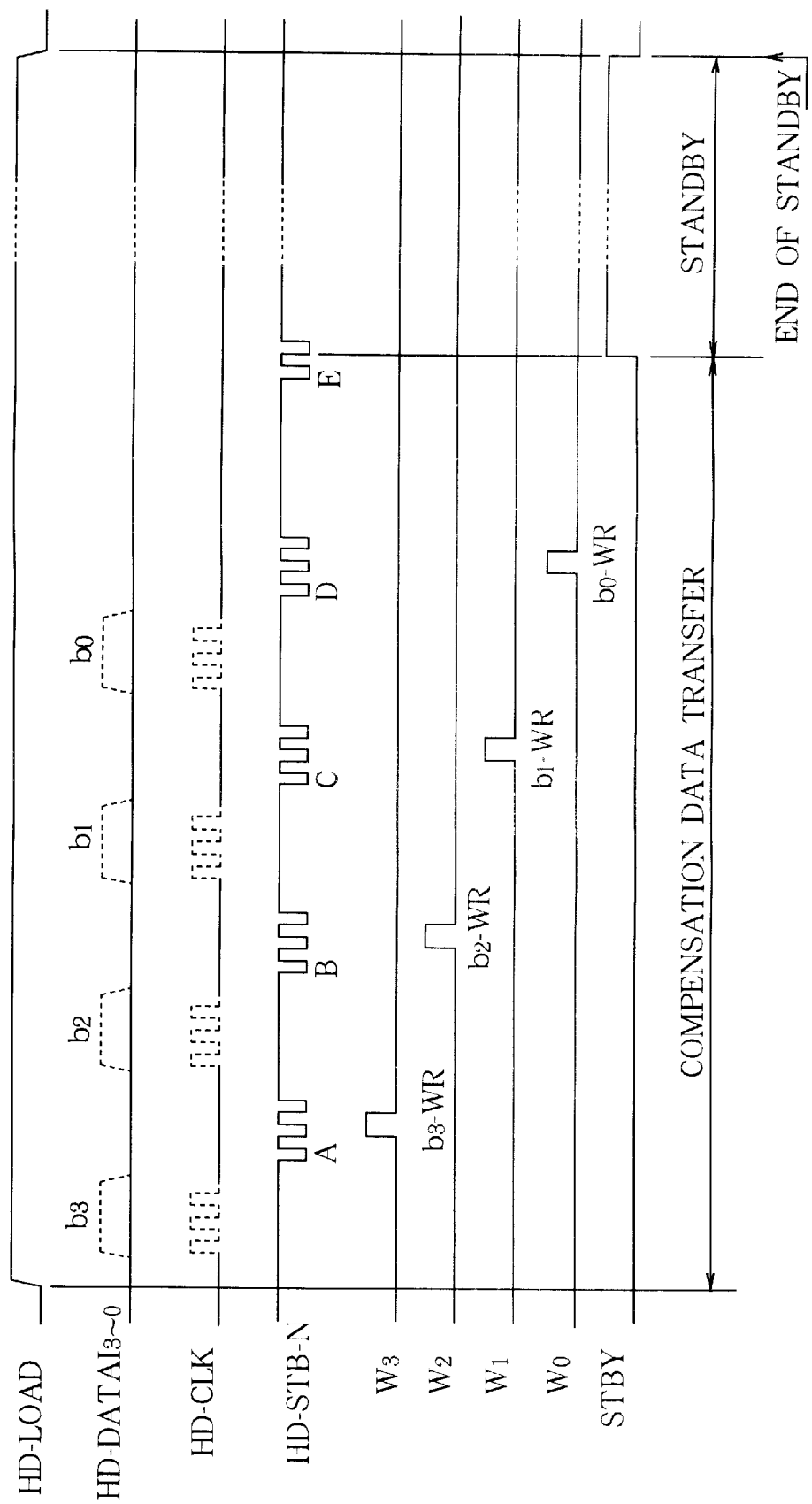
FIG. 26 is a timing diagram illustrating a transition to the standby mode in the third embodiment.

FIG. 26 illustrates the transfer of compensation data followed by a transition to the standby mode. The illustrated signals are the signals shown in FIG. 25, and the standby mode control signal output from the standby (STBY) terminal of the control circuit CTRL. Following the three strobe pulses (D) that activate write control signal $b_0$-WR to write the $b_0$ bits of compensation data into the memory circuits, the printing control unit 30 generates two more strobe pulses (E). At the first of these strobe pulses, the Johnson counter in FIG. 22 increments to a state in which the Q output of flip-flop 382 is high and the Q outputs of flip-flops 383 and 384 are low. At the second strobe pulse, the ring counter increments to a state in which the Q output of flip-flop 380 is low and the Q output of flip-flop 381 is high. AND gate 387 responds to these outputs by activating the standby mode control signal STBY-P, placing the control-voltage generating circuit ADJ in the standby mode. The printing control unit 30 does not generate a third strobe pulse, so the standby mode control signal STBY-P remains active and the standby mode continues.

In the standby mode, the driver ICs DRV1 to DRV26 draw substantially no current. The reason is that in each driver IC, PMOS transistor 111 is switched off in the control-voltage generating circuit ADJ, and PMOS transistors 71, 72, 73, and 113 are switched off in the operational amplifier 110, as explained in the first and second embodiments.

To exit the standby mode, the printing control unit 30 drives the load signal HD-LOAD to the inactive (low) level, as illustrated in FIG. 26, resetting the flip-flops in the control circuit CTRL and causing the standby mode control signal STBY-P to go low. The printer is now ready to begin the printing sequence. The printing control unit 30 can also end the standby mode by generating another strobe pulse (not illustrated), causing the ring counter in the control circuit CTRL to increment, the Q output of flip-flop 381 to go low, and the standby mode control signal STBY-P to go low.

In a variation of the operation shown in FIG. 26, strobe pulses (HD-STB-N) are generated as shown, but no clock pulses are generated and no compensation data are transferred, as indicated by the dotted lines in the HD-DATA$_{3-0}$ and HD-CLK waveforms. The standby mode is entered at the fourteenth strobe pulse. This operation is useful in quiescent-current testing of the individual driver ICs.

The third embodiment provides the same effects as the first and second embodiments, reducing current consumption by the LED head 31 to only a few microamperes in the standby mode, and enabling quiescent-current testing of the individual driver ICs. In addition, by using the same counters in the control circuit CTRL to generate both the write control signals ($b_0$-WR to $b_3$-WR) and the standby mode control signal (STBY-P), the third embodiment enables both the compensation function and the standby function to be controlled by the conventional load and strobe signals, without the need for additional input-output terminals in the driver ICs or additional wire-bonding interconnections.

In a variation of the third embodiment, the compensation data are stored in a non-volatile memory in the LED head 31, and transferred from the non-volatile memory to the driver ICs through data selectors that select either driving data or compensation data.

In another variation, the decoding circuits in FIG. 22 are configured so that the standby mode control signal is activated before the write control signals.

The invention has been described in relation to an electrophotographic printer, but can also be used to reduce standby power consumption and simplify testing of the driver ICs in thermal printers, display devices, and various other devices in which a driving circuit drives a group of driven elements.

Those skilled in the art will recognize that further variations are possible within the scope claimed below.

What is claimed is:

1. A driving circuit driving a plurality of driven elements according to externally supplied driving data, comprising:
   a plurality of drive output circuits supplying driving current to respective driven elements responsive to the driving data and a control voltage;
   a transfer circuit coupled to said drive output circuits, transferring said driving data to said drive output circuits;
   a control-voltage generating circuit coupled to said drive output circuits, generating said control voltage by causing current to flow on a static current path, the control-voltage generating circuit including a switching element opening and closing said static current path; and
   a control circuit coupled to said control-voltage generating circuit, receiving a standby command, said control circuit generating a standby mode control signal responsive to said standby command, and said switching element opening and closing said static current path responsive to logic levels of said standby mode control signal, wherein said standby command is given by a combination of external signals, said external signals also controlling at least one of said transfer circuit and said drive output circuit.

2. The driving circuit of claim 1, wherein said external signals include a first timing signal controlling said transfer circuit, and a second timing signal controlling said drive output circuits.

3. The driving circuit of claim 1, wherein said control circuit comprises:
   a counter operating in response to said external signals; and
   a decoding circuit decoding an output of said counter, thereby generating said standby mode control signal.

4. The driving circuit of claim 3, further comprising a plurality of memory circuits storing compensation data, wherein:
   said transfer circuit also transfers said compensation data to said memory circuits;
   said decoding circuit also generates write control signals controlling writing of said compensation data into said memory circuits; and
   said drive output circuits supply said driving current to said driven elements according to a combination of said driving data, said control voltage, and said compensation data.

5. The driving circuit of claim 1, wherein said driven elements are light-emitting diodes.

6. The driving circuit of claim 1, wherein said driving circuit is an integrated circuit formed on a single semiconductor chip.

7. A printer comprising:
   a plurality of driving circuits as described in claim 6, and
   a printing control unit supplying said standby command to said plurality of driving circuits.

8. The driving circuit of claim 1, wherein:
   the drive output circuits have respective driving transistors coupled in series with respective driven elements, said driving transistor being switched on and off responsive to the driving data and said driving transistors being driven by the control voltage when switched on;

the driving current supplied through said driving transistors to said driven elements has a fixed relationship to the current flowing on the static current path in said control-voltage generating circuit; and the control voltage generating circuit includes an operational amplifier having an input terminal coupled to said static current path and an output terminal at which said control voltage is generated; and a transistor coupled in series with said switching element on said static current path, driven by said control voltage.

9. The driving circuit of claim 8, wherein said operational amplifier comprises:

a first current-source transistor supplying a control current responsive to a bias voltage;

a resistive element coupled in series with said first current-source transistor, generating said bias voltage by conducting said control current;

at least one second current-source transistor driven by said bias voltage;

a first switching transistor coupled in series with said resistive element, switched off by said control circuit when said control circuit receives said standby command; and a second switching transistor coupled to said resistive element in parallel with said first current-source transistor, switched on by said control circuit when said control circuit receives said standby command, thereby altering said bias voltage and switching off said second current-source transistor.

10. A driving circuit driving a plurality of driven elements according to externally supplied driving data, comprising:

a plurality of drive output circuits having respective driving transistors coupled in series with respective driven elements, supplying driving current to the respective driven elements responsive to the driving data and a control voltage, said driving transistors being switched on and off responsive to the driving data and said driving transistors being driven by the control voltage when switched on;

a transfer circuit coupled to said drive output circuits, transferring said driving data to said drive output circuits;

a control-voltage generating circuit coupled to said drive output circuits, generating said control voltage by causing current to flow on a static current path the driving current supplied through said driving transistors to said driven elements having a fixed relationship to the current flowing on the static current path;

a transistor coupled in series with said node on said static current path, driven by said control voltage; and a switching element disposed between said transistor and said node on said static current path for receiving a standby command, opening said static current path when said standby command is received, and closing said static current path when said standby command is not received, the control-voltage generating circuit including:

an operational amplifier having an input terminal coupled to a node on said static current path and an output terminal at which said control voltage is generated said operational amplifier comprising;

a first current-source transistor supplying a control current responsive to a bias voltage;

a resistive element coupled in series with said first current-source transistor, generating said bias voltage by conducting said control current;

at least one second current-source transistor driven by said bias voltage;

a first switching transistor coupled to said resistive element in a series with said first current source transistor, switched on when said first current-source transistor is switched on, and switched off when a said switching element receives said standby command; and a second switching transistor coupled to said resistive element in parallel with said first current source transistor, switched off when said first switching transistor is switched on, and switched on when said first switching transistor is switched off, altering said bias voltage and thereby switching off said second current-source transistor when said switching element receives said standby command.

11. The driving circuit of claim 10, wherein said driven elements are light-emitting diodes.

12. The driving circuit of claim 10, wherein said driving circuit is an integrated circuit formed on a single semiconductor chip.

13. A printer comprising:

a plurality of driving circuits as described in claim 12, and a printing control unit supplying said standby command to said plurality of driving circuits.

* * * * *